US009252192B2

(12) United States Patent
Lee

(10) Patent No.: US 9,252,192 B2
(45) Date of Patent: Feb. 2, 2016

(54) METHODS OF MANUFACTURING SEMICONDUCTOR DEVICES INCLUDING A CROSS POINT CELL ARRAY

(71) Applicant: SK hynix Inc., Icheon (KR)

(72) Inventor: Hyun Jin Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/531,813

(22) Filed: Nov. 3, 2014

(65) Prior Publication Data

US 2015/0372061 A1 Dec. 24, 2015

(30) Foreign Application Priority Data

Jun. 20, 2014 (KR) ........................ 10-2014-0075980

(51) Int. Cl.
*H01L 21/20* (2006.01)
*H01L 27/24* (2006.01)
*H01L 45/00* (2006.01)

(52) U.S. Cl.
CPC ........ *H01L 27/2481* (2013.01); *H01L 45/1233* (2013.01); *H01L 45/1683* (2013.01)

(58) Field of Classification Search
CPC ........... G11C 13/0007; G11C 2213/31; G11C 2213/77; H01L 27/2463; H01L 45/04; H01L 45/1233; H01L 45/1253; H01L 45/147; H01L 45/1625
USPC ........................... 257/2, 4, 5; 438/381, 382, 3
See application file for complete search history.

(56) References Cited

U.S. PATENT DOCUMENTS

| | | | | |
|---|---|---|---|---|
| 5,977,579 | A * | 11/1999 | Noble | H01L 27/10867 257/296 |
| 7,804,708 | B2 * | 9/2010 | Gruening-von Schwerin | G11C 13/0004 257/2 |
| 7,879,626 | B2 * | 2/2011 | Ohnishi | G11C 13/0007 257/E21.664 |
| 8,258,496 | B2 * | 9/2012 | Toda | H01L 21/7682 257/296 |
| 8,630,114 | B2 * | 1/2014 | Lue | G11C 11/4097 257/324 |
| 8,822,971 | B2 * | 9/2014 | Park | H01L 45/06 257/2 |
| 8,895,437 | B2 * | 11/2014 | Cernea | H01L 27/249 257/208 |
| 8,945,949 | B2 * | 2/2015 | Hwang | H01L 43/12 257/E21.004 |
| 2009/0261315 | A1 * | 10/2009 | Toda | H01L 21/7682 257/5 |
| 2011/0024713 | A1 * | 2/2011 | Kamata | H01L 45/06 257/2 |
| 2011/0140070 | A1 * | 6/2011 | Kim | G11C 5/02 257/5 |
| 2012/0135580 | A1 | 5/2012 | Scheuerlein et al. | |
| 2013/0121061 | A1 | 5/2013 | Herner et al. | |
| 2013/0248804 | A1 | 9/2013 | Kawai | |
| 2013/0288391 | A1 * | 10/2013 | Lee | H01L 45/16 438/3 |
| 2014/0301127 | A1 * | 10/2014 | Kim | G11C 13/0004 365/148 |

* cited by examiner

*Primary Examiner* — Mohammed Shamsuzzaman

(57) ABSTRACT

A method of fabricating a semiconductor device is provided. The method includes an intermediate pattern structure on a substrate. The intermediate pattern structure includes a pair of first conductive lines extending in a first direction, a pair of first conductive connectors connecting end portions the pair of first conductive lines to each other, a pair of second conductive lines intersecting the pair of first conductive lines, and a pair of second conductive connectors connecting end portions of the pair of second conductive lines to each other. The first and second conductive connectors are selectively removed using a cut mask pattern to separate the pair of first conductive lines from each other and to separate the pair of second conductive lines from each other.

18 Claims, 25 Drawing Sheets

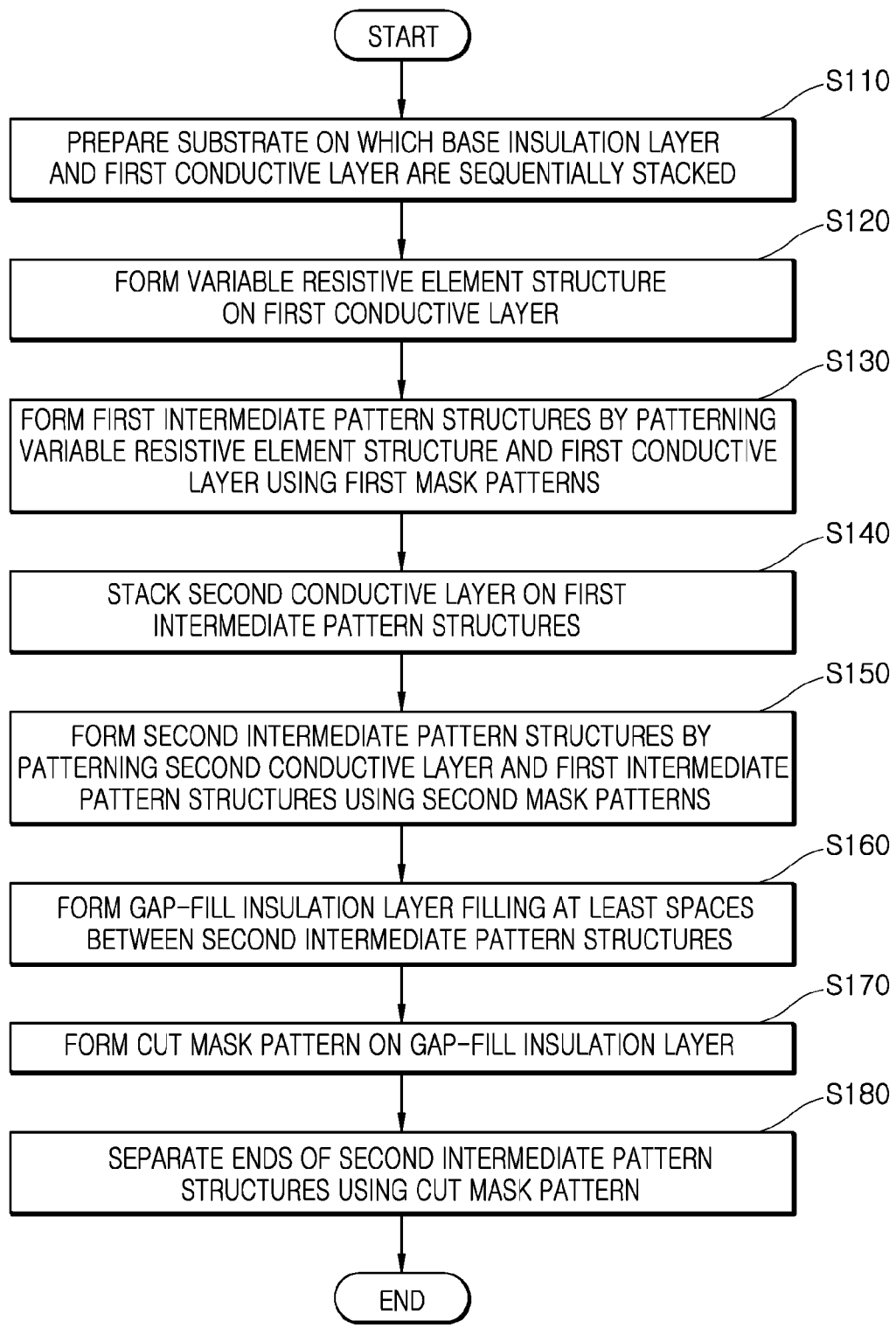

FIG. 2A
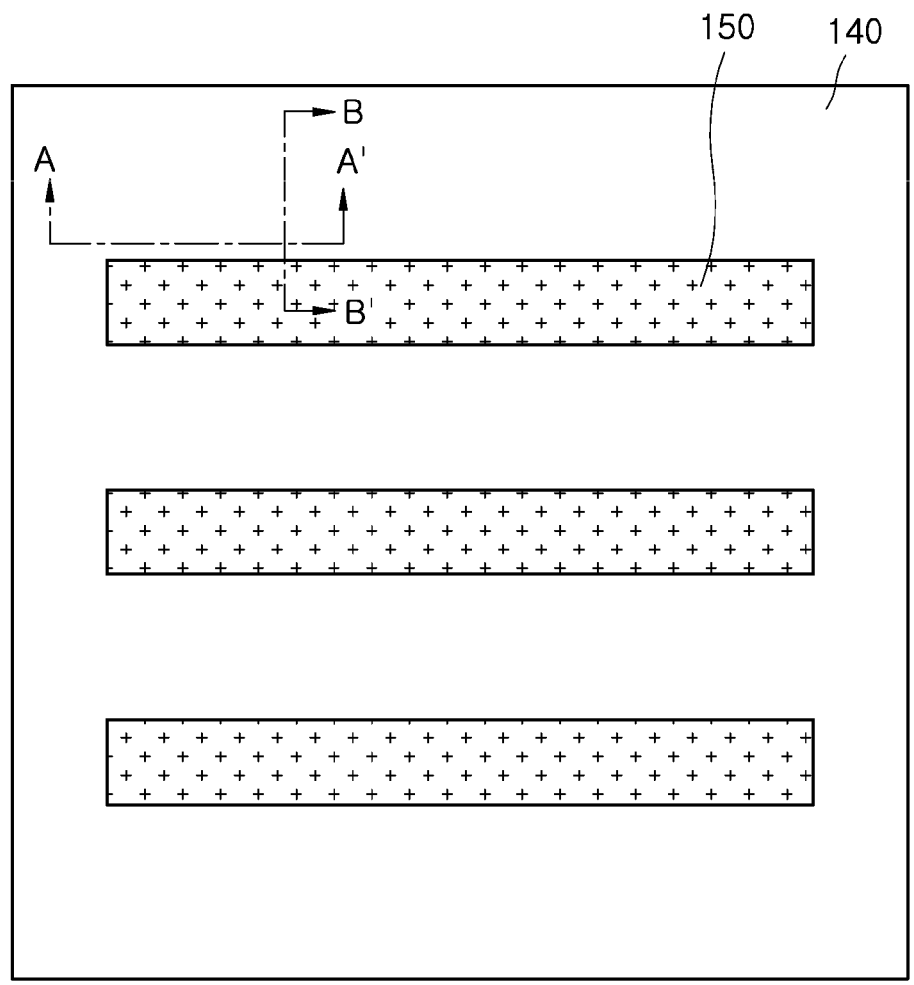
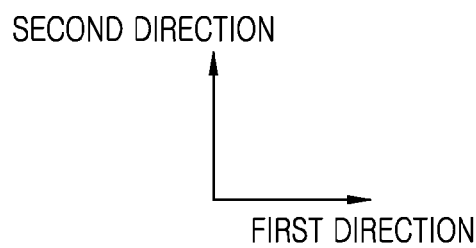

FIG. 3A
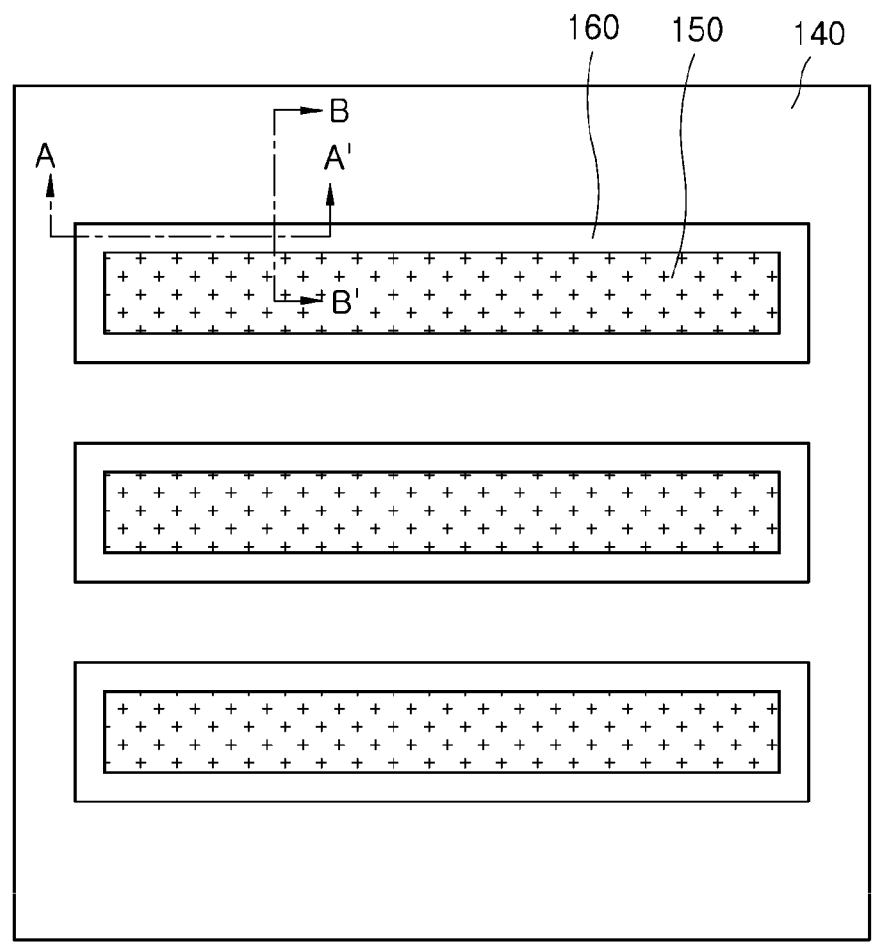
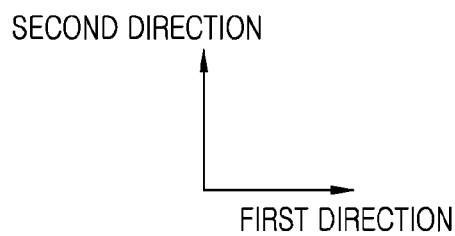

FIG. 4A
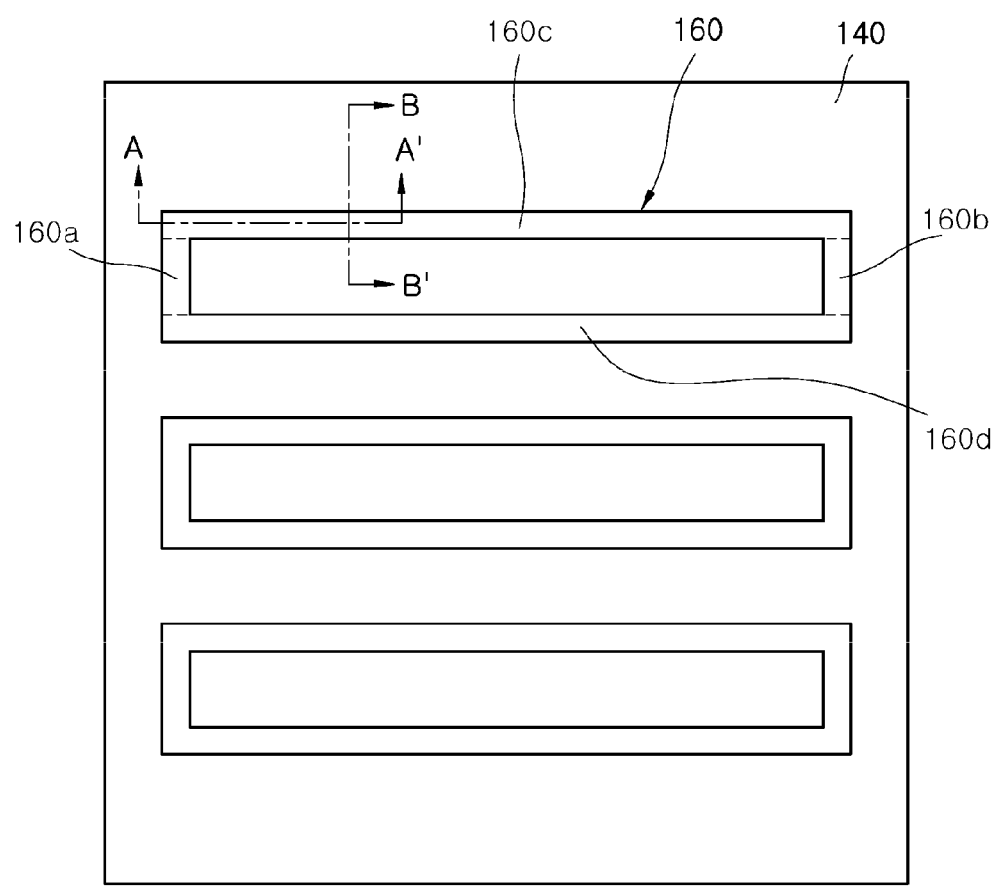
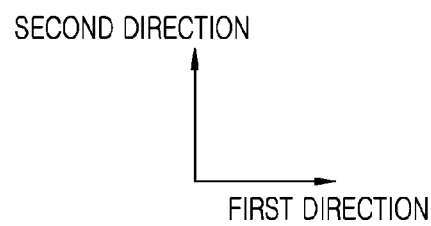

FIG. 8A
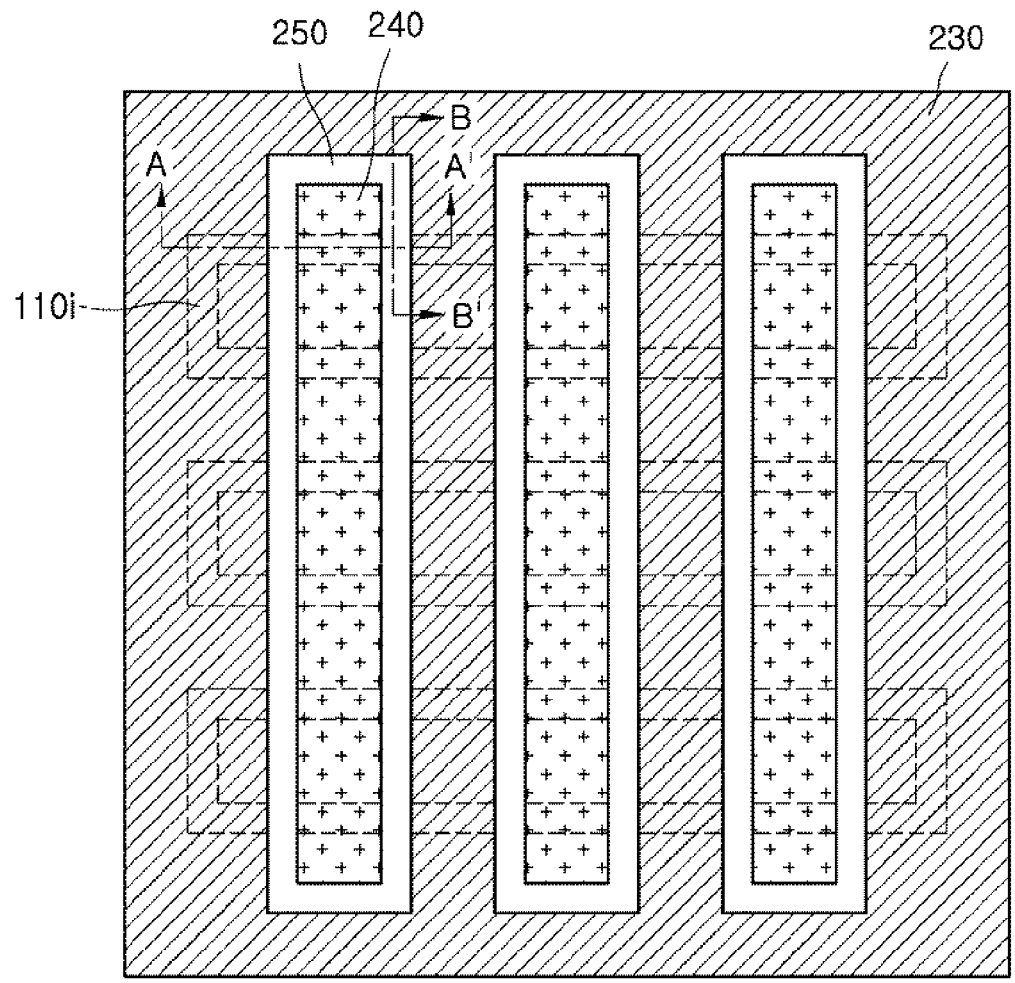
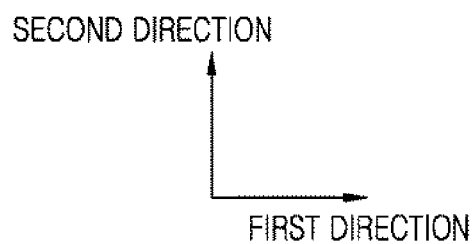

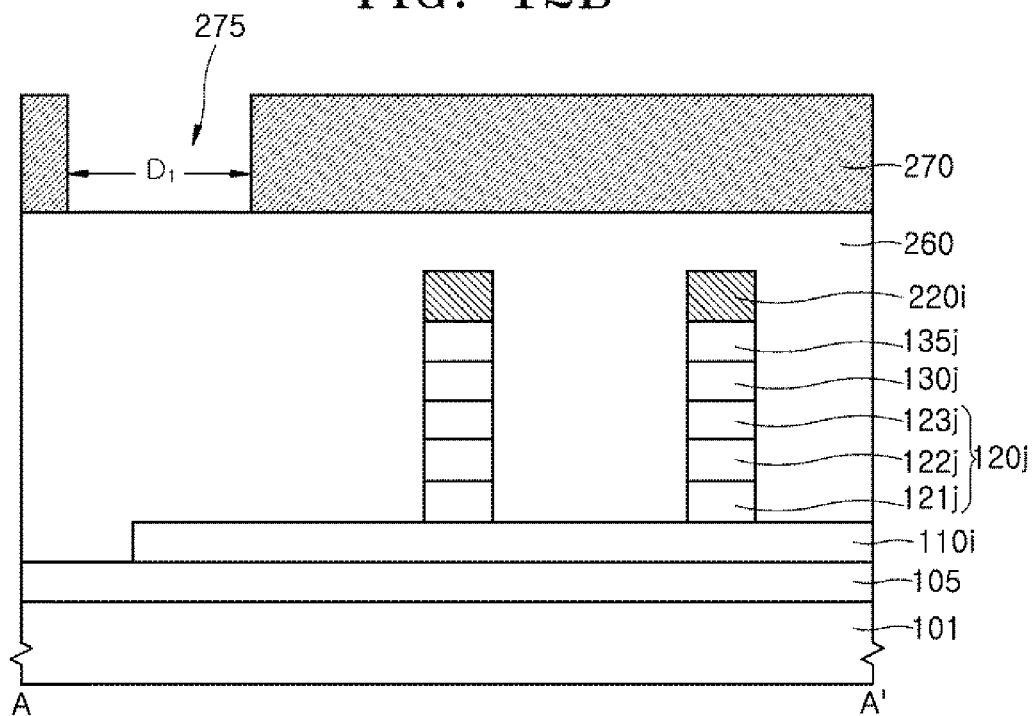
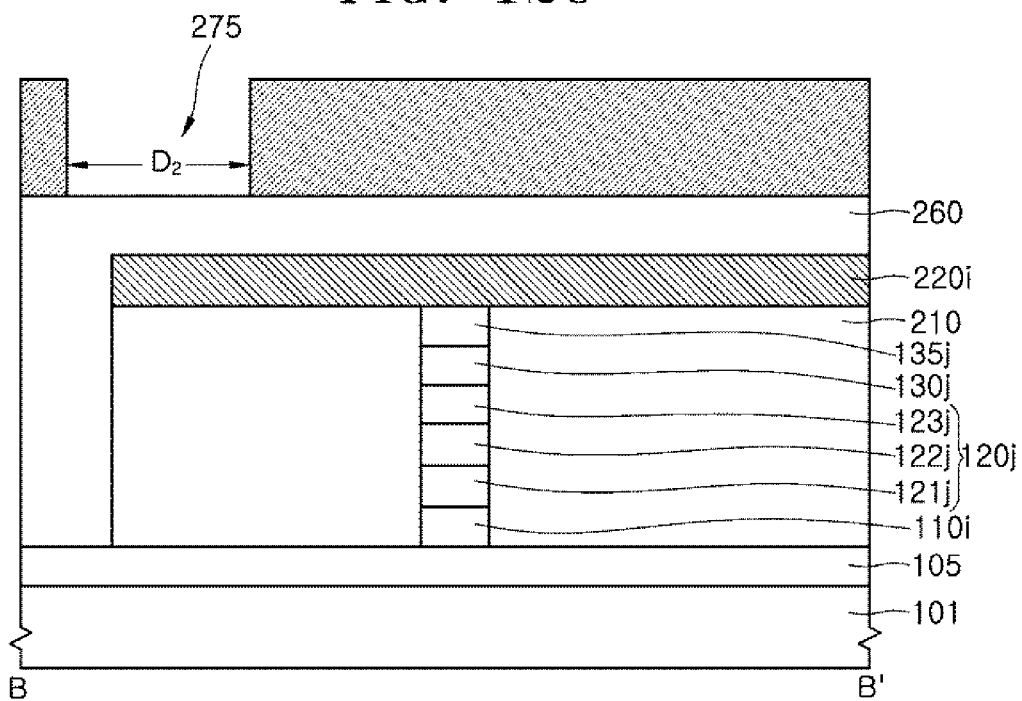

FIG. 13A
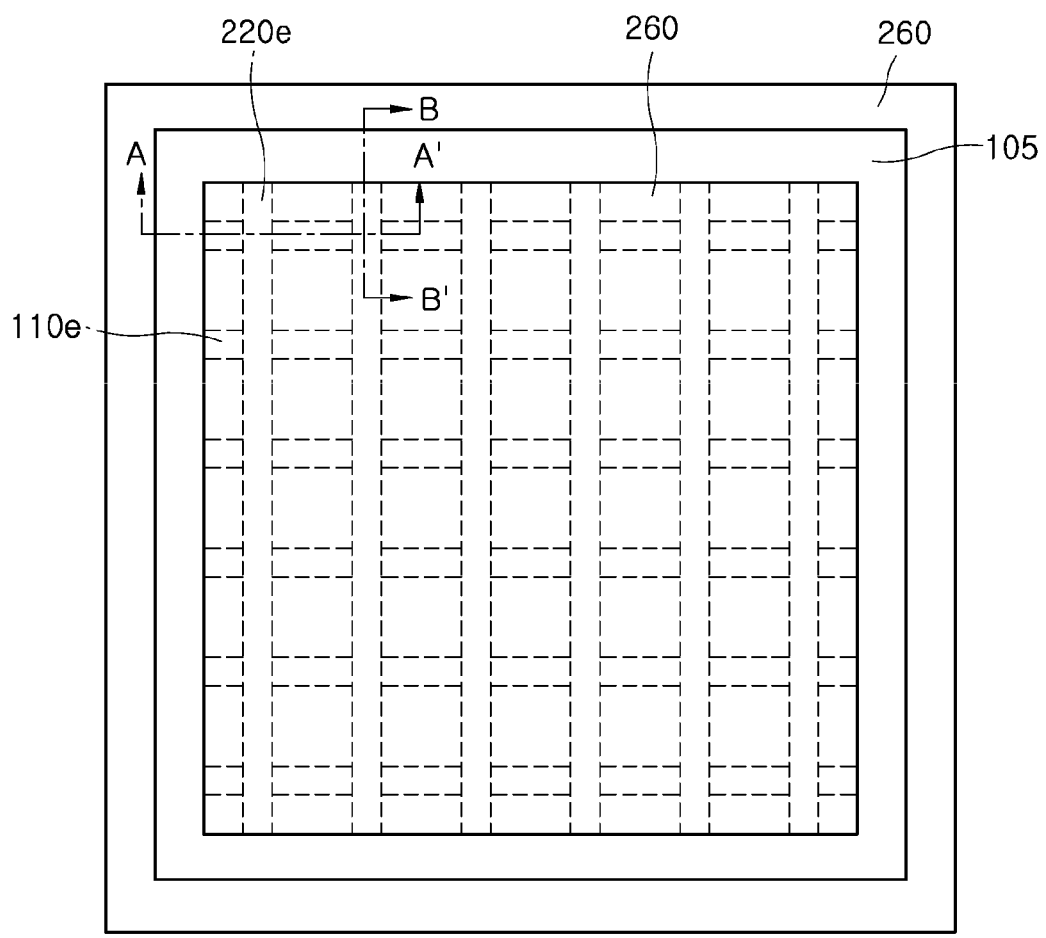
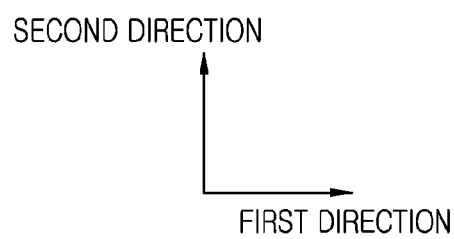

METHODS OF MANUFACTURING SEMICONDUCTOR DEVICES INCLUDING A CROSS POINT CELL ARRAY

CROSS-REFERENCE TO RELATED APPLICATION

The present application claims priority under 35 U.S.C. 119(a) to Korean Patent Application No. 10-2014-0075980, filed on Jun. 20, 2014, in the Korean Intellectual Property Office, which is incorporated herein by reference in its entirety as set forth in full.

BACKGROUND

1. Technical Field

Embodiments of the present disclosure relate to methods of manufacturing semiconductor devices including a cross point cell array.

2. Related Art

A cross point cell array structure is employed in cell array regions of highly integrated semiconductor devices. The cross point cell array structure includes a plurality of pillar-shaped cells, which are disposed at cross points of lower electrodes and upper electrodes crossing the lower electrodes.

In order to form the cross point cell array structure, processes for patterning a lower electrode layer, a data storage layer and an upper electrode layer are performed. For example, a semiconductor memory device having a cross point cell array structure and a method of manufacturing the same are taught in U.S. Pat. No. 7,879,626 B2 to Ohnishi et al., entitled "Structure and Manufacturing Method of Semiconductor Memory Device."

SUMMARY

Various embodiments are directed to methods of manufacturing semiconductor devices including a cross point cell array.

According to an embodiment, a method of manufacturing a semiconductor device includes forming a first stack structure including a first conductive layer over a substrate and forming a first mask pattern on the first stack structure. The first mask pattern includes a pair of first line-shaped patterns extending in a first direction and a pair of first end connectors connecting both end portions of one of the pair of first line-shaped patterns to corresponding end portions of the other of the pair of first line-shaped patterns, respectively. The first stack structure is etched using the first mask pattern as an etch mask to form a first intermediate pattern structure including a pair of parallel line patterns. A first gap-fill insulation layer is formed to fill a space between the parallel line patterns of the first intermediate pattern structure. A second stack structure including a second conductive layer is formed over the first gap-fill insulation layer and the first intermediate pattern structure. A second mask pattern is formed over the second stack structure. The second mask pattern includes a pair of second line-shaped patterns extending in a second direction crossing the first direction and a pair of second end connectors connecting both end portions of one of the pair of second line-shaped patterns to corresponding end portions of the other of the pair of second line-shaped patterns, respectively. The second stack structure and the first intermediate pattern structure are etched using the second mask pattern as an etch mask to form a second intermediate pattern structure. The second intermediate pattern structure includes a pair of first conductive lines extending in the first direction, a pair of first conductive connectors connecting both end portions of one of the pair of first conductive lines to corresponding end portions of the other of the pair of first conductive lines, a pair of second conductive lines crossing the pair of first conductive lines, a pair of second conductive connectors connecting both end portions of one of the pair of second conductive lines to corresponding end portions of the other of the pair of second conductive lines. A second gap-fill insulation layer is formed over the substrate to fill a space between the pair of second conductive lines of the second intermediate pattern structure. A cut mask pattern is formed over the second gap-fill insulation layer to expose portions of the second gap-fill insulation layer disposed over the first and second conductive connectors. The second gap-fill insulation layer and the second intermediate pattern structure are etched using the cut mask pattern as an etch mask to remove the first and second conductive connectors.

According to another embodiment, a method of fabricating a semiconductor device having a cross point array includes forming a first conductive layer over a base insulating layer and a variable resistive element structure over the first conductive layer and patterning the variable resistive element structure and the first conductive layer using a first mask pattern having a sidewall spacer shape to form a first intermediate pattern structure including a pair of parallel line patterns. The first mask pattern includes a pair of first line-shaped patterns extending in a first direction and a pair of first end connectors connecting both end portions of one of the pair of first line-shaped patterns to corresponding end portions of the other of the pair of first line-shaped patterns. A first gap-fill insulation layer is formed over the base insulation layer to fill a space between the pair of the parallel line patterns of the first intermediate pattern structure. A second conductive layer is formed over the first intermediate pattern structure and the base insulation layer. The second conductive layer and the first intermediate pattern structure are patterned using a second mask pattern having a sidewall spacer shape to form a second intermediate pattern structure. The second intermediate pattern structure is formed to include a pair of first conductive lines extending in the first direction, a pair of first conductive connectors connecting both end portions of one of the pair of first conductive lines to corresponding end portions of the other of the pair of first conductive lines, a pair of second conductive lines crossing the pair of first conductive lines, a pair of second conductive connectors connecting both end portions of one of the pair of second conductive lines to corresponding end portions of the other of the pair of second conductive lines, and pillar structures disposed at intersections of the first and second conductive lines including variable resistive elements. A second gap-fill insulation layer is formed to fill spaces between the pair of second conductive lines of the second intermediate pattern structure to cover sidewalls of the variable resistive elements of the second intermediate pattern structure. A cut mask pattern is formed over the gap-fill insulation layer to expose portions of the second gap-fill insulation layer disposed over the first and second conductive connectors. The second gap-fill insulation layer and the second intermediate pattern structure are etched using the cut mask pattern as an etch mask to remove the first and second conductive connectors while the sidewalls of the variable resistive elements are covered by the first and second gap-fill insulation layers.

According to still another embodiment, a method of fabricating a semiconductor device having a cross point cell array includes forming a first stack structure including a first conductive layer over a substrate and a first mask pattern over the first stack structure, wherein the first mask pattern has a sidewall spacer shape. The first stack structure is etched using the first mask pattern as an etch mask to form a first intermediate pattern structure including a first conductive pattern. The first conductive pattern includes a pair of first conductive lines extending in a first direction and a pair of first conductive connectors connecting both end portions of one of the pair of first conductive lines to corresponding end portions of the other of the pair of first conductive lines, respectively. A first gap-fill insulation layer is formed to fill a space between the first intermediate pattern structure and an adjacent first intermediate pattern structure and a space surrounded by the first intermediate pattern structure. A second stack structure is formed to include a second conductive layer over the first gap-fill insulation layer and the first intermediate pattern structure. A second mask pattern is formed to have a sidewall spacer shape over the second stack structure. The second stack structure and the first intermediate pattern structure are etched using the second mask pattern as an etch mask to form a second intermediate pattern structure. The second intermediate pattern structure includes the first conductive pattern and a second conductive pattern. The second conductive pattern includes a pair of second conductive lines extending in a second direction, crossing the first direction, to cross the pair of first conductive lines, and a pair of second conductive connectors connect both end portions of one of the pair of second conductive lines to corresponding end portions of the other of the pair of second conductive lines, respectively. A second gap-fill insulation layer is formed to fill a space between the second intermediate pattern structure and an adjacent second intermediate pattern structure and a space surrounded by the second intermediate pattern structure. A cut mask pattern is formed over the second gap-fill insulation layer to expose portions of the second gap-fill insulation layer disposed over the first and second conductive connectors. The second gap-fill insulation layer and the second intermediate pattern structure are etched using the cut mask pattern as an etch mask to remove the first and second conductive connectors.

BRIEF DESCRIPTION OF THE DRAWINGS

Embodiments of the present disclosure will become more apparent in view of the attached drawings and accompanying detailed description, in which:

FIG. 1 is a flowchart illustrating a method of manufacturing a semiconductor device according to an embodiment;

FIGS. 2A to 13A are plan views illustrating a method of manufacturing a semiconductor device according to an embodiment;

FIGS. 2B to 13B are cross-sectional views taken along a line A-A' of FIGS. 2A to 13A, respectively;

FIGS. 2C to 13C are cross-sectional views taken along a line B-B' of FIGS. 2A to 13A, respectively.

DETAILED DESCRIPTION

Figure 2B:
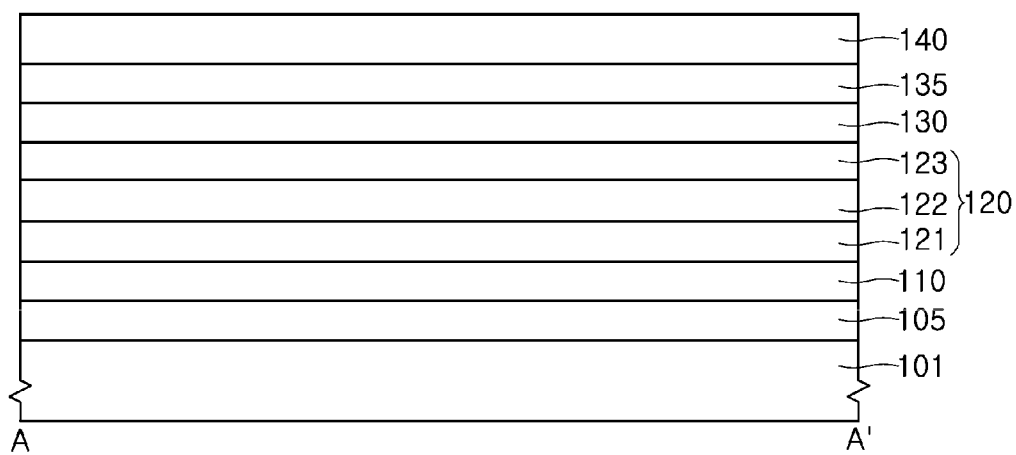

Various embodiments will now be described more fully hereinafter with reference to the accompanying drawings. In the drawing figures, the dimensions of layers and regions may be exaggerated for clarity of illustration. It will be understood that when an element is referred to as being "on," "above", "below," or "under" another element, it can be directly "on," "above", "below," or "under" the other element, respectively, or intervening elements may also be present. Like reference numerals refer to like elements throughout.

As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof. Moreover, in method embodiments such as fabrication method embodiments, process steps of the methods may be performed in different sequences from the order which is described in the specification unless the context clearly indicates otherwise. That is, the process steps of the methods may be performed in the same sequence as described in the specification or in a different sequence thereto, or some of the process steps of the methods may be simultaneously performed.

FIG. 1 is a flowchart illustrating a method of manufacturing a semiconductor device according to an embodiment. Referring to FIG. 1, a substrate may be provided, and a base insulation layer and a first conductive layer may be sequentially formed on the substrate (see step S110). The substrate may be a silicon substrate or a gallium arsenide substrate, but not limited thereto. In other embodiments, the substrate may be a ceramic substrate, a polymer substrate, or a metallic substrate to which semiconductor fabrication processes are applicable. The substrate may include integrated circuits. The first conductive layer may include a metal layer such as a tungsten layer, a titanium layer, a tantalum layer, a platinum layer, a gold layer, an aluminum layer or a copper layer, but not limited thereto. In other embodiments, the first conductive layer may include a conductive nitride layer, a conductive oxide layer or a doped semiconductor layer.

A variable resistive element structure may be formed on the first conductive layer (see step S120). The variable resistive element structure may include a first electrode layer, a variable resistive layer and a second electrode layer. In some embodiments, the variable resistive element structure may include a resistive random access memory (RRAM) cell structure, a phase-change random access memory (PCRAM) cell structure, or a magnetic random access memory (MRAM) cell structure.

The variable resistive element structure and the first conductive layer may be patterned together using first mask patterns as etch masks, thereby forming first intermediate pattern structures (see step S130). The first mask patterns may include two line-shaped patterns that extend in a first direction and are arrayed along a second direction intersecting with the first direction.

Corresponding end portions of the two line-shaped patterns that are adjacent to each other may be connected to each other. The first mask patterns may include a nitride layer, an oxide layer, an oxynitride layer or a silicon layer.

In some embodiments, the first intermediate pattern structures may be formed using the following process steps. First, line-shaped photoresist patterns extending in the first direction may be formed on the variable resistive element structure. Subsequently, spacers may be formed on sidewalls of the line-shaped photoresist patterns, and the line-shaped photoresist patterns may be removed. The variable resistive element structure and the first conductive layer may be etched using the spacers as etch masks. As a result, a planar shape of the spacers functioning as the first mask patterns may be transferred to the variable resistive element structure and the first conductive layer to form the first intermediate pattern structures. Accordingly, each of the first intermediate pattern structures may include a pair of parallel line patterns extending in the first direction and a pair of end connectors extending in the second direction. Corresponding end portions of the pair of parallel line patterns that are adjacent to each other may be connected to each other through a corresponding one of the pair of end connectors. In an embodiment, the first intermediate pattern structures include variable resistive element patterns and first conductive patterns, which are formed by etching the variable resistive element structure and the first conductive layer, respectively.

As described above, the first intermediate pattern structures may be fabricated by forming spacers on sidewalls of line-shaped patterns (e.g., line-shaped photoresist patterns) extending in the first direction, removing the line-shaped patterns, and patterning an underlying structure including the variable resistive element structure and the first conductive layer using the spacers as etch masks. This technology will be referred to as a spacer patterning technology (SPT) in the present disclosure. As described above, according to an embodiment, the line-shaped patterns may be formed of a photoresist material. However, embodiments of the present disclosure are not limited thereto. In other embodiments, the line-shaped patterns may be formed of any material having an etch rate higher than that of the spacers.

A second conductive layer may be stacked on the first intermediate pattern structures (see step S140). The second conductive layer may include a metal layer such as a tungsten layer, a titanium layer, a tantalum layer, a platinum layer, a gold layer, an aluminum layer or a copper layer, but not limited thereto. In other embodiments, the second conductive layer may include a conductive nitride layer, a conductive oxide layer or a doped semiconductor layer.

In some embodiments, a first gap-fill insulation layer may be formed on the first intermediate pattern structures to fill spaces between the first intermediate pattern structures before forming the second conductive layer, and the first gap-fill insulation layer may be planarized to expose top surfaces of the first intermediate pattern structures. In such a case, the second conductive layer may be formed on the planarized first gap-fill insulation layer and the exposed first intermediate pattern structures. The first gap-fill insulation layer may include a material layer having an etch rate higher than that of the base insulation layer.

The second conductive layer and the first intermediate pattern structures may be patterned using second mask patterns, thereby forming second intermediate pattern structures (see a step S150). The second mask patterns may include two line-shaped patterns that extend in the second direction and are arrayed along the first direction. Corresponding end portions of the two line-shaped patterns that are adjacent to each other may be connected to each other. The second mask patterns may include a nitride layer, an oxide layer, an oxynitride layer or a silicon layer.

In some embodiments, the second intermediate pattern structures may be formed using an SPT process including the following process steps. First, line-shaped photoresist patterns extending in the second direction may be formed on the second conductive layer. Subsequently, spacers may be formed on sidewalls of the line-shaped photoresist patterns, and the line-shaped photoresist patterns may be removed. The second conductive layer and the first intermediate pattern structures may be etched using the spacers as etch masks to expose portions of the base insulation layer and portions of the first conductive patterns. That is, first portions of the second conductive layer and first portions of the first intermediate pattern structures, which are disposed over the first conductive patterns, may be etched until the first conductive patterns are exposed. Moreover, second portions of the second conductive layer and second portions of the first intermediate pattern structures, which are not disposed over the first conductive patterns, may be etched until the base insulation layer is exposed.

In some embodiments, each of the second intermediate pattern structures may include a pair of first conductive lines, a pair of first conductive connectors, a pair of second conductive lines, a pair of second conductive connectors, and pillar structures disposed at intersections of the first and second conductive lines. The first conductive line may be a line-shaped pattern which is formed by patterning the first conductive layer and the second conductive line may be a line-shaped pattern which is formed by patterning the second conductive layer. The pair of first conductive connectors may connect both end portions of one of the pair of first conductive lines to corresponding end portions of the other of the pair of first conductive lines, respectively. Similarly, the pair of second conductive connectors may connect both end portions of one of the pair of second conductive lines to corresponding end portions of the other of the pair of second conductive lines, respectively. The pillar structure may include at least the variable resistive element structure. Thus, the pillar structure may constitute an RRAM cell.

A gap-fill insulation layer may fill at least spaces between the second intermediate pattern structures (see step S160). Hereinafter, the gap-fill insulation layer will be referred to as a second gap-fill insulation layer to distinguish it from the first gap-fill insulation layer.

In some embodiments, a second gap-fill insulation material may be disposed on the second intermediate pattern structures and the exposed base insulation layer to fill spaces between the second intermediate pattern structures and an internal space surrounded by each of the second intermediate pattern structures. Subsequently, the deposited second gap-fill insulation material may be planarized using an etch-back process or a polishing process to form the second gap-fill insulation layer. The second gap-fill insulation layer may include a material having an etch rate higher than that of the base insulation layer.

A cut mask pattern may be formed on the second gap-fill insulation layer and the second intermediate pattern structures (see step S170). The cut mask pattern may be formed of a photoresist layer. In some embodiments, the cut mask pattern may expose portions of the second gap-fill insulation layer which are disposed over the first and second conductive connectors and end portions of the first and second conductive lines.

The pair of first conductive lines may be separated from each other by an etch process performed using the cut mask pattern as an etch mask, and the pair of second conductive lines may also be separated from each other by the etch process performed using the cut mask pattern as an etch mask (see step S180). Specifically, the second gap-fill insulation layer, the second conductive lines, the first conductive lines and the first gap-fill insulation layer may be etched using the cut mask pattern as an etch mask, thereby exposing the base insulation layer. As a result, the first and second conductive connectors, which are disposed between corresponding end portions of the pair of first conductive lines adjacent to each other and between corresponding end portions of the pair of second conductive lines adjacent to each other, respectively, may be removed to electrically disconnect the first and second conductive lines.

As a result of the above embodiments, a reliable semiconductor device including a cross point RRAM cell array may be fabricated using an SPT process.

If the first and second intermediate pattern structures are formed using the SPT process, the first and second conductive lines are formed to have fine patterns. As a result, the degree of integration of a semiconductor device having a cross point cell array structure in which a plurality of memory cells is disposed at intersections between the first and second conductive lines may be increased. In such a case, both end portions of one of the pair of first or second conductive lines may be connected to corresponding end portions of the other of the pair of first or second conductive lines, respectively. According to an embodiment, both end portions of one of the pair of first (or second) conductive lines may be separated from corresponding end portions of the other of the pair of first (or second) conductive lines by performing a single etch process after forming the first and second conductive lines. During the etch process, sidewalls of each RRAM cell may be covered with first and second gap-fill insulation layers. Thus, the sidewalls of each RRAM cell are prevented from being exposed to an oxygen atmosphere during the separation process of the first and second conductive lines. That is, this embodiment may prevent oxidation of the sidewalls of each RRAM cell during the separation process to improve the reliability of the semiconductor device including the cross point RRAM cell array. This will be described in detail with reference to the following drawings.

FIGS. 2A to 13A are plan views illustrating a method of manufacturing a semiconductor device according to an embodiment. FIGS. 2B to 13B are cross-sectional views taken along a line A-A' of FIGS. 2A to 13A, respectively, and FIGS. 2C to 13C are cross-sectional views taken along a line B-B' of FIGS. 2A to 13A, respectively.

Figure 2C:
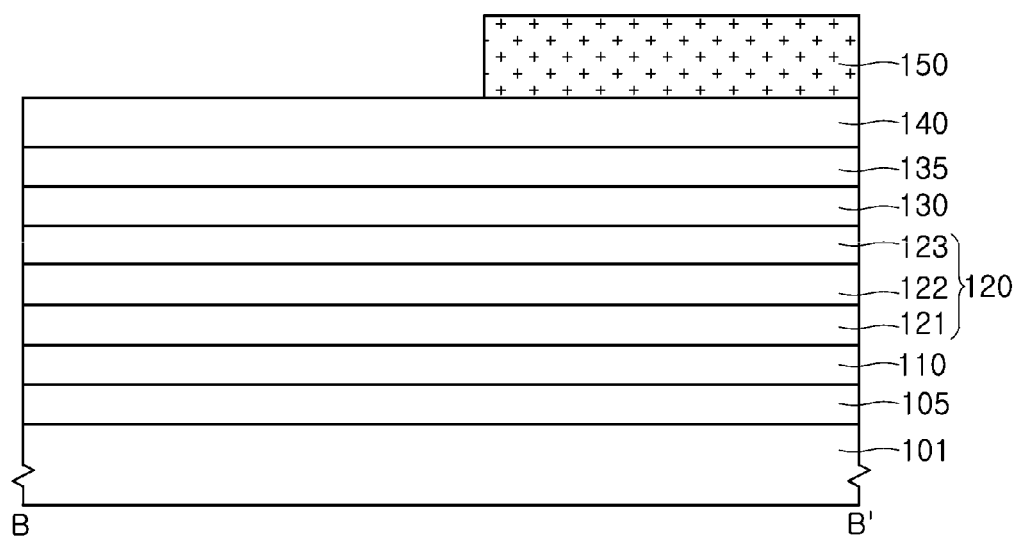

Referring to FIGS. 2A, 2B and 2C, a substrate 101 may be provided. The substrate 101 may be a silicon substrate or a gallium arsenide substrate, but not limited thereto. In other embodiments, the substrate 101 may be a ceramic substrate, a polymer substrate, or a metallic substrate to which semiconductor fabrication processes are applicable. The substrate 101 may include integrated circuits therein and/or thereon.

A base insulation layer 105 may be formed on the substrate 101. The base insulation layer 105 may include an oxide layer, a nitride layer or an oxynitride layer. In some embodiments, the base insulation layer 105 may be formed using a chemical vapor deposition (CVD) process or a coating process. A first conductive layer 110 may be formed on the base insulation layer 105. The first conductive layer 110 may include a metal layer such as a tungsten layer, a titanium layer, a tantalum layer, a platinum layer, a gold layer, an aluminum layer or a copper layer, but not limited thereto. In other embodiments, the first conductive layer 110 may include a conductive nitride layer, a conductive oxide layer or a doped semiconductor layer. The first conductive layer 110 may be formed using a physical vapor deposition (PVD) process or a CVD process.

A variable resistive element structure 120 may be formed on the first conductive layer 110. The variable resistive element structure 120 may include a first electrode layer 121, a variable resistive layer 122 and a second electrode layer 123, which are sequentially stacked on the first conductive layer 110. The variable resistive element structure 120 may include an RRAM cell structure, a PCRAM cell structure, or an MRAM cell structure. A resistance value of the variable resistive layer 122 may vary according to a magnitude and/or a polarity of a voltage applied to the first and second electrode layers 121 and 123, or vary according to an amount of a current flowing therethrough between the first and second electrode layers 121 and 123. In some embodiments, the variable resistive layer 122 may include a metal oxide layer such as a titanium oxide layer, a niobium oxide layer, a copper oxide layer, a zirconium oxide layer, a manganese oxide layer, a hafnium oxide layer, a tungsten oxide layer or a tantalum oxide layer. In other embodiments, the variable resistive layer 122 may include a material having a perovskite structure, for example, a praseodymium calcium manganese oxide ($Pr_{0.7}Ca_{0.3}MnO_3$) material, a $La_{1-x}Ca_xMnO_3$ (LCMO) material, a $Ba_{0.5}Sr_{0.5}Co_{0.8}Fe_{0.2}O_3$ (BSCFO) material, a $YBa_2Cu_3O_7$ (YBCO) material, a $(Ba,Sr)TiO_3(Cr,Nb)$ material, a $SrZrO_3(Cr,V)$ material, a $(La,Sr)MnO_3$ material, a $Sr_{1-x}La_xTiO_3$ material, a $La_{1-x}Sr_xFeO_3$ material, a $La_{1-x}Sr_xCoO_3$ material, a $SrFeO_{2.7}$ material, a $LaCoO_3$ material, a $RuSr_2GdCu_2O_3$ material or a $YBa_2Cu_3O_7$ material. In yet other embodiments, the variable resistive layer 122 may include a metal sulfide material, for example, an $Ag_2S$ material, a $Cu_2S$ material, a CdS material or a ZnS material. In still other embodiments, the variable resistive layer 122 may include a chalcogenide material containing germanium (Ge), stibium (Sb) and tellurium (Te). In yet still other embodiments, the variable resistive layer 122 may include a cobalt material, e.g., a CoFe material, a CoFeB material, a CoCr material or a CoCrPt material.

Each of the first and second electrode layers 121 and 123 may include a metal material, a conductive metal oxide material or a conductive metal nitride material. In such a case, the metal material may include a platinum (Pt) material, a ruthenium (Ru) material, a gold (Au) material, a silver (Ag) material or an iridium (Ir) material. At least one of the first and second electrode layers 121 and 123 may contain carbon. For example, the first or second electrode layer 121 or 123 may include a conductive carbon material such as a carbon nano tube (CNT) material or a graphene material. The first and second electrode layers 121 and 123 may be formed using a PVD process or a CVD process.

A selection element structure 130 may be formed on the variable resistive element structure 120. The selection element structure 130 may be a structure for forming selection elements used to select memory cells including variable resistive elements in a subsequent process. In some embodiments, each of the selection elements may be a PN diode, a PIN diode, a tunnel barrier device or an ovonic device. The selection element structure 130 may include a single-layered selection element layer or a multi-layered selection element layer. In some embodiments, formation of the selection element structure 130 may be omitted.

A barrier layer 135 may be formed on the selection element structure 130. The barrier layer 135 may be disposed between the selection element structure 130 and a conductive layer (e.g., second conductive layer 220 of FIGS. 6B and 6C) to be formed in a subsequent process to function as an adhesion layer or a diffusion barrier layer. The barrier layer 135 may include, for example, a titanium (Ti) layer, a titanium nitride (TiN) layer, or a tantalum nitride (TaN) layer. The barrier layer 135 may be formed using a physical vapor deposition (PVD) process or a chemical vapor deposition (CVD) process. In some embodiments, formation of the barrier layer 135 may be omitted.

A first hard mask layer 140 may be formed on the barrier layer 135. The first hard mask layer 140 may include an oxide layer, a nitride layer, an oxynitride layer, or a silicon layer. The first hard mask layer 140 may include a material having an etch rate lower than those of the barrier layer 135, the selection element structure 130, the variable resistive element structure 120, and the first conductive layer 110.

Line-shaped photoresist patterns 150 may be formed on the first hard mask layer 140. The line-shaped photoresist patterns 150 may extend in a first direction (e.g., a horizontal direction with respect to the orientation of FIG. 2A). The line-shaped photoresist patterns 150 may be formed by coating a photoresist layer, exposing the photoresist layer with a photo mask, and developing the exposed photoresist layer.

Figure 3B:
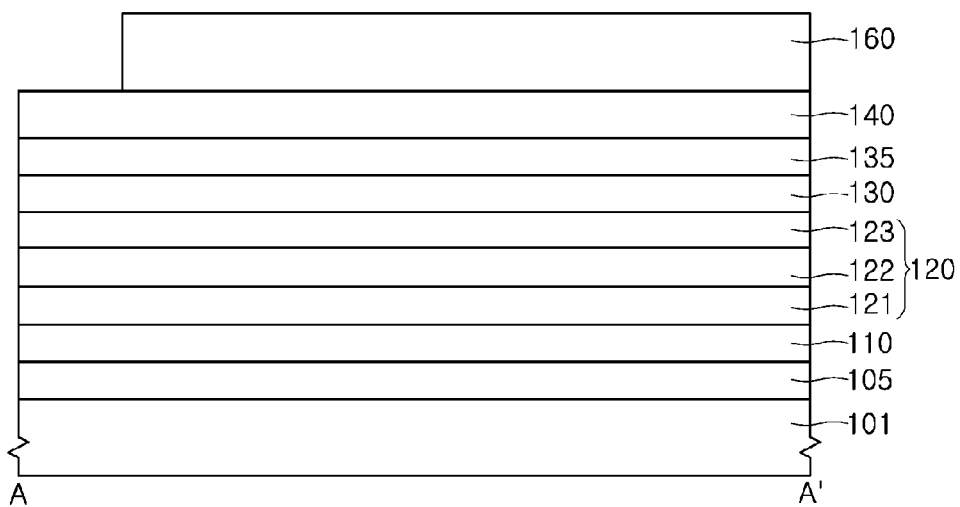
Figure 3C:
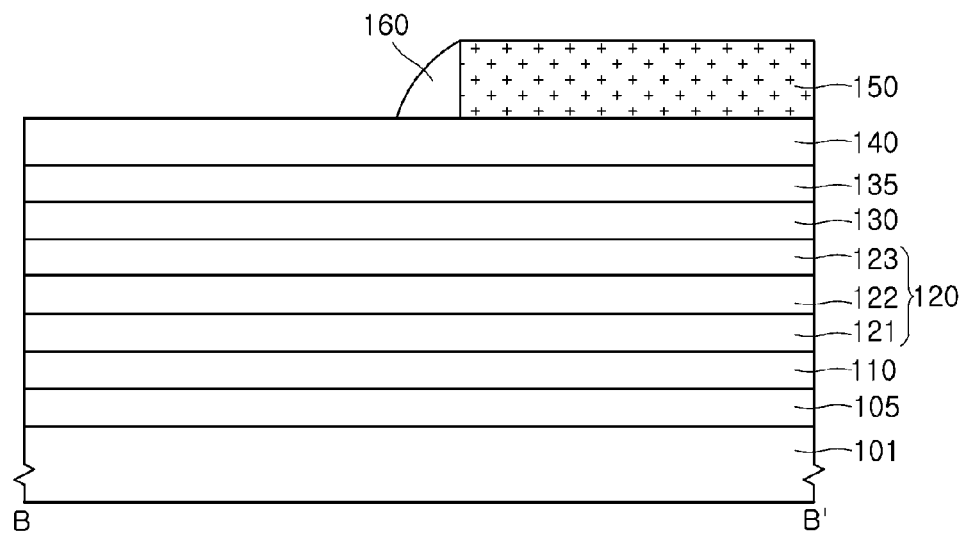

Referring to FIGS. 3A, 3B and 3C, spacers 160 may be formed on sidewalls of the photoresist patterns 150. The spacers 160 may be formed of an oxide layer, a nitride layer or an oxynitride layer. The spacers 160 may be formed by depositing a spacer layer on the photoresist patterns 150 and etching back the spacer layer. The spacer layer may be formed using a CVD process or a coating process. As a result, the spacers 160 have a cross-section of a sidewall spacer as shown in FIG. 3C. Each of the spacers 160 may be formed on four sidewalls of a corresponding one of the photoresist patterns 150.

Figure 4B:
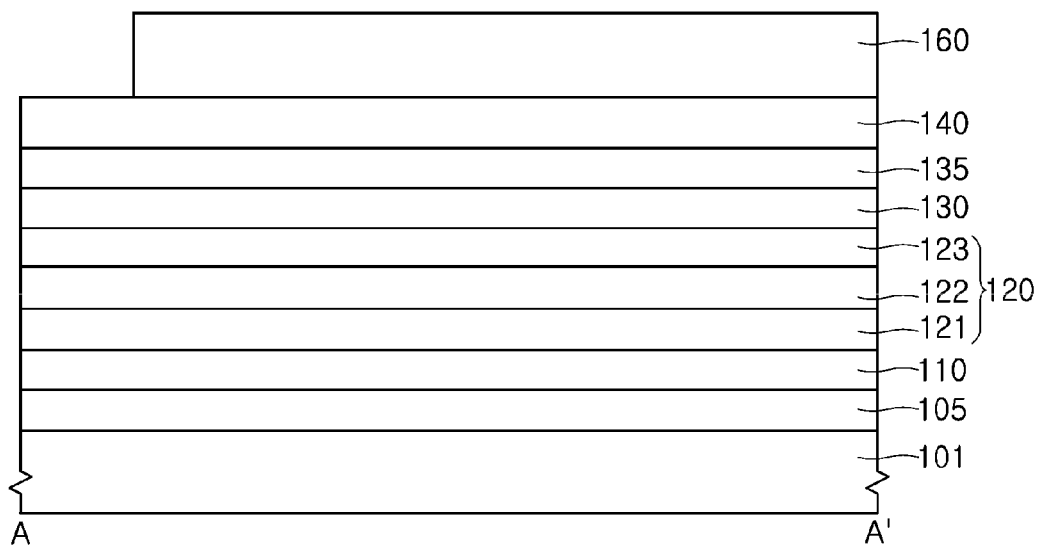
Figure 4C:
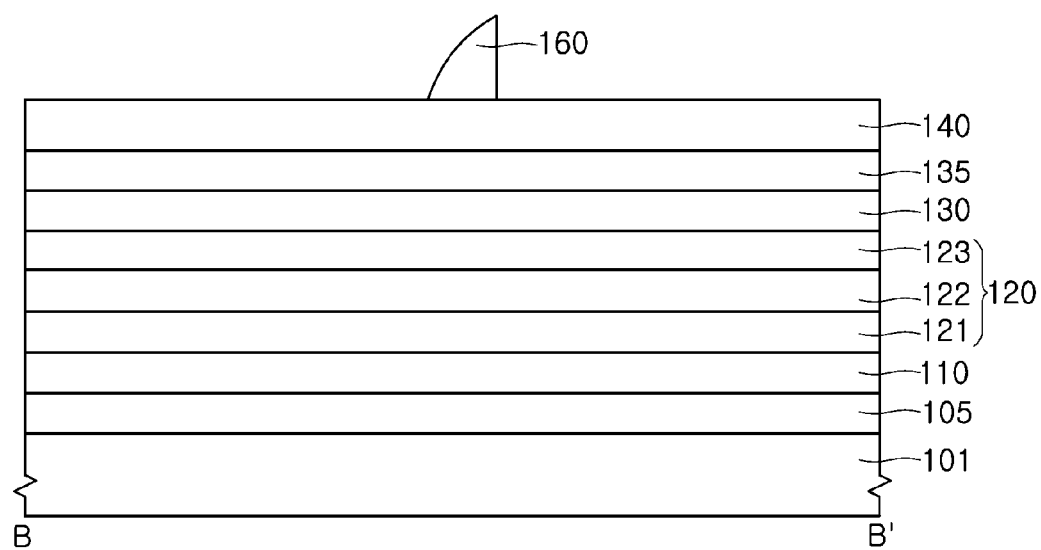

Referring to FIGS. 4A, 4B and 4C, the photoresist patterns 150 may be removed so that only the spacers 160 remain on the first hard mask layer 140. Each of the spacers 160 may include a pair of parallel line patterns 160c and 160d (also referred to herein as a pair of line-shaped patterns) extending in the first direction and a pair of end connectors 160a and 160b extending in a second direction (e.g., a vertical direction with respect to the orientation of FIG. 4A) crossing the first direction. The end connectors 160a and 160b connect both end portions of one of the pair of parallel line patterns, e.g., 160c, to corresponding end portions of the other of the pair of parallel line patterns, e.g., 160d, respectively. That is, each of the spacers 160 may have a rectangular shape including the pair of parallel line patterns 160c and 160d extending in the first direction and the pair of end connectors 160a and 160b extending in the second direction substantially perpendicular to the first direction.

Figure 5A:
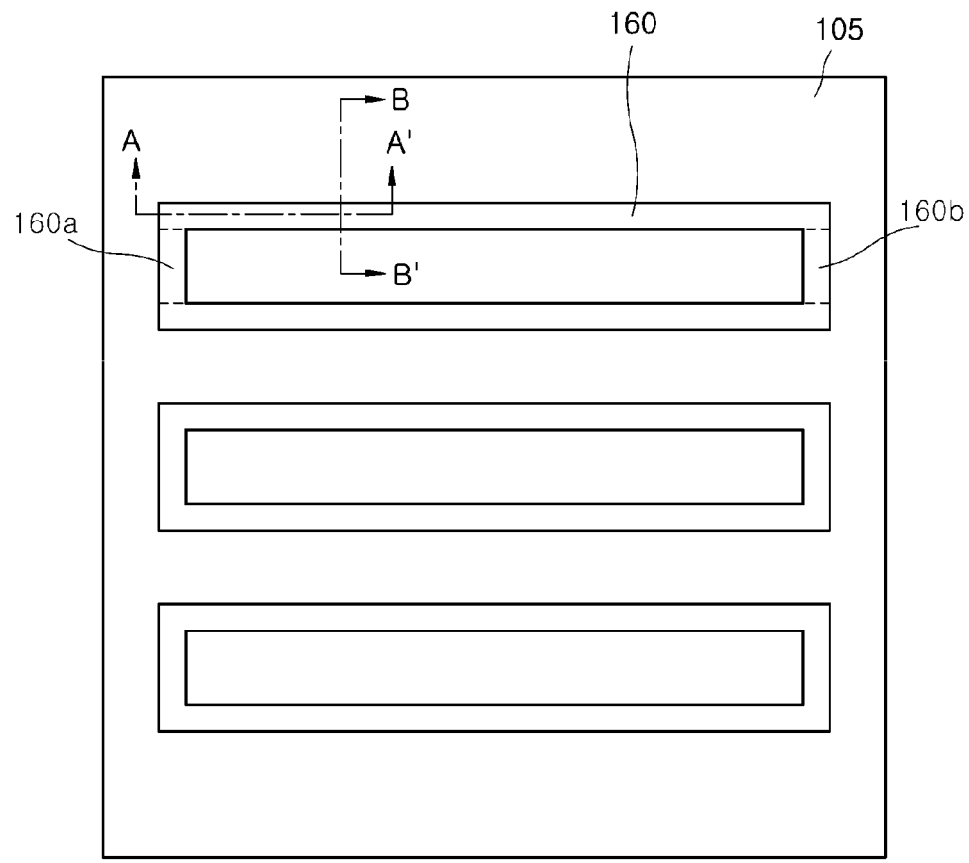
Figure 5B:
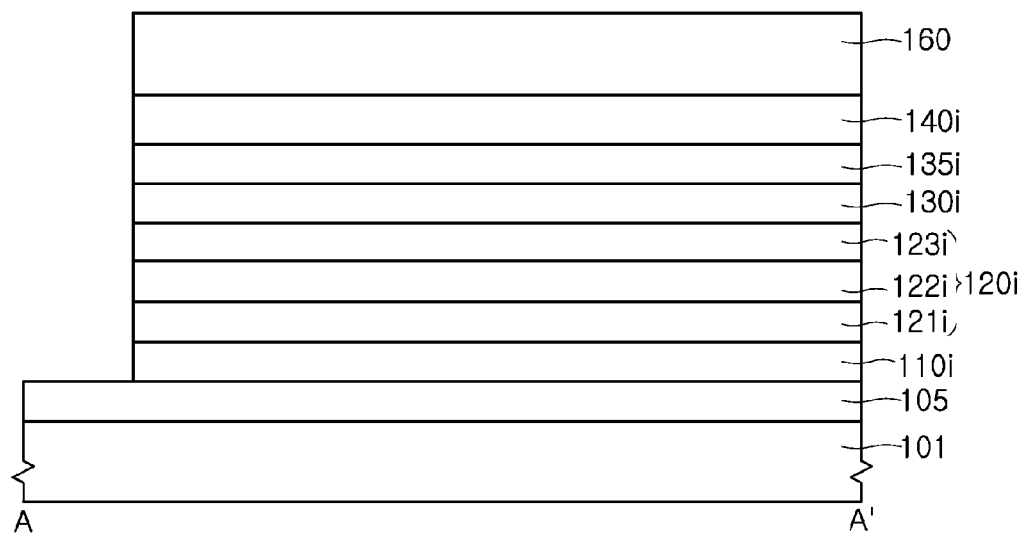
Figure 5C:
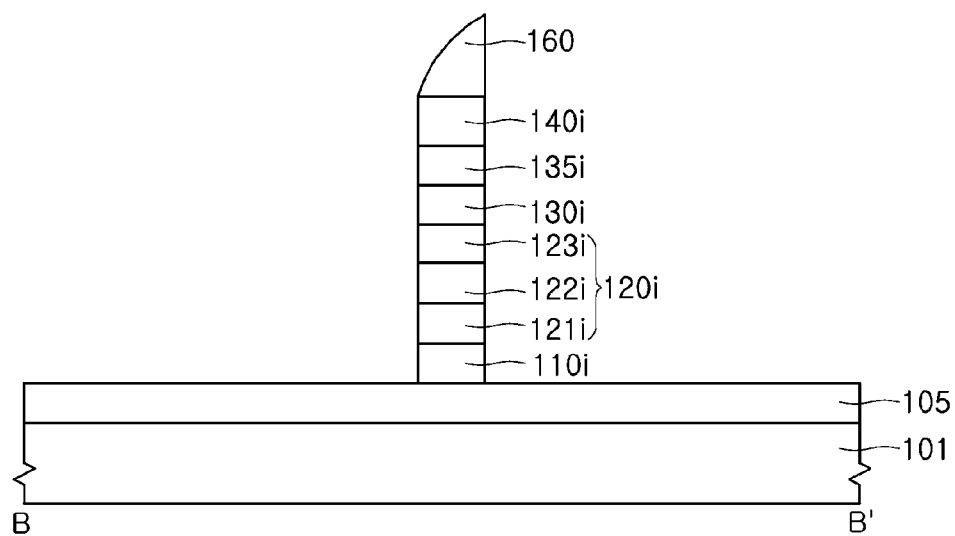

Referring to FIGS. 5A, 5B and 5C, the first hard mask layer 140, the barrier layer 135, the selection element structure 130, the variable resistive element structure 120, and the first conductive layer 110 may be etched using the spacers 160 (also referred to herein as first mask patterns) as etch masks, thereby forming first hard mask patterns 140i, barrier patterns 135i, selection element patterns 130i, variable resistive element patterns 120i, and first conductive patterns 110i included in first intermediate pattern structures. In such a case, each of the variable resistive element patterns 120i may include a first electrode pattern 121i, a variable resistive pattern 122i and a second electrode pattern 123i, which are sequentially stacked. The etch process for forming first intermediate pattern structures may be performed until the base insulation layer 105 is exposed. The first intermediate pattern structures may include the barrier patterns 135i, the selection element patterns 130i, the variable resistive element patterns 120i, and the first conductive patterns 110i. During the etch process for forming the first intermediate pattern structures, a pattern shape of the first mask patterns 160 may be transferred to the first hard mask layer 140 to provide the first hard mask patterns 140i. That is, the first hard mask patterns 140i may have substantially the same pattern shape as the first mask patterns 160. Thus, the first hard mask patterns 140i may substantially act as etch masks while the first intermediate pattern structures are formed. Accordingly, each of the first intermediate pattern structures may also have substantially the same pattern shape as a corresponding one of the first mask patterns 160. That is, each of the first intermediate pattern structures may include a pair of parallel line patterns extending in the first direction and a pair of end connectors extending in the second direction. The end connectors connect both end portions of one of the pair of parallel line patterns to corresponding end portions of the other of the pair of parallel line patterns, respectively, when viewed from the top of the first intermediate pattern structures.

Figure 6A:
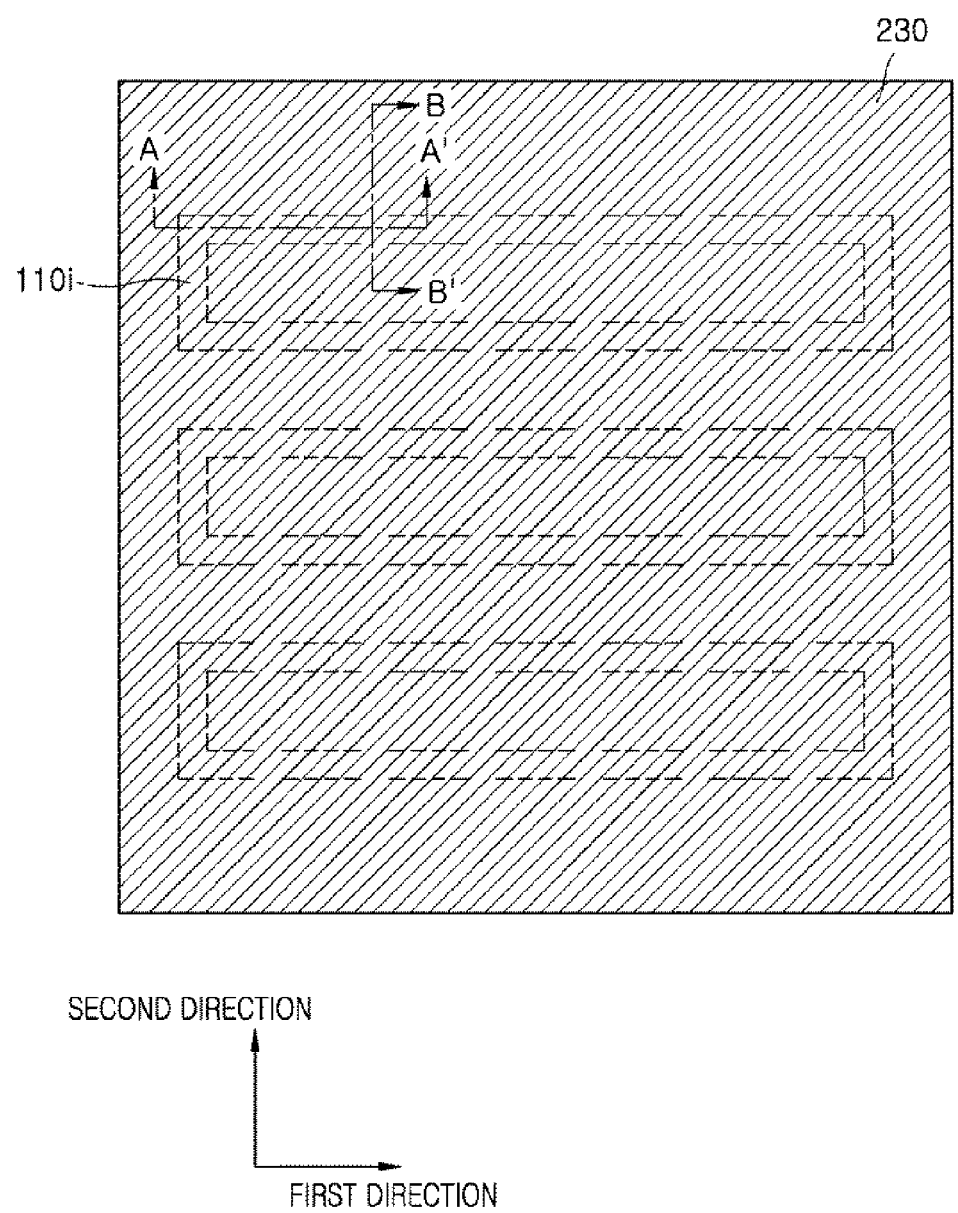
Figure 6B:
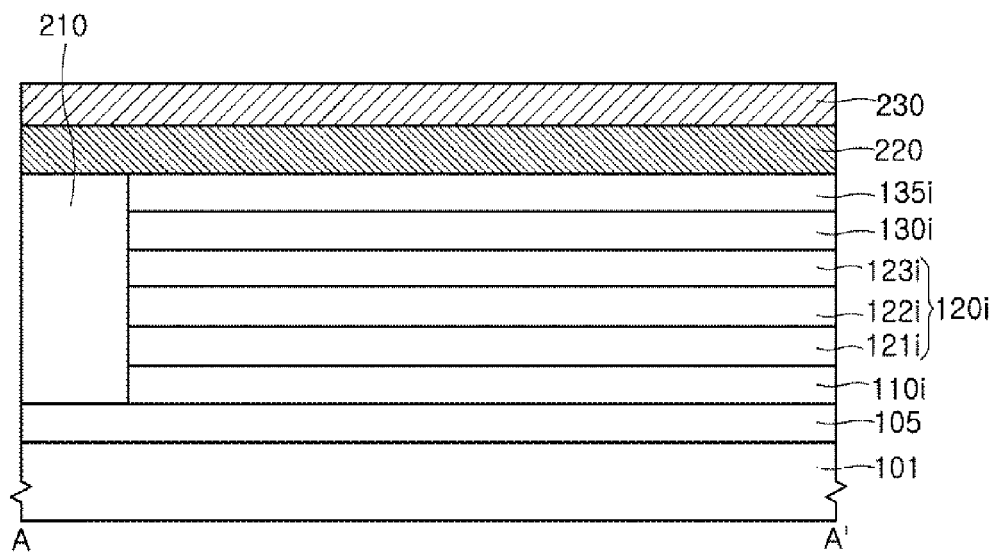
Figure 6C:
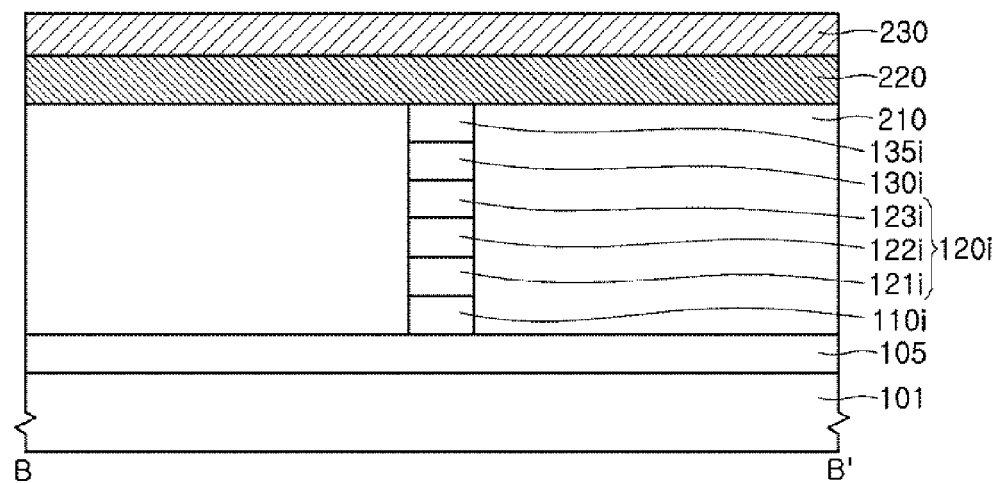

Referring to FIGS. 6A, 6B and 6C, a first gap-fill insulation material may be deposited on the base insulation layer 105 to fill at least gap regions between the first intermediate pattern structures and inside regions surrounded by the first intermediate pattern structures. In addition, the first gap-fill insulation material may cover the first intermediate pattern structures and the first mask patterns 160. Subsequently, the deposited first gap-fill insulation material may be planarized to expose top surfaces of the barrier patterns 135i of the first intermediate pattern structures and form a first gap-fill insulation layer 210. As a result, a top surface of the planarized first gap-fill insulation layer 210 may be substantially coplanar with the top surfaces of the barrier patterns 135i. The first gap-fill insulation layer 210 may include a material having an etch rate higher than that of the base insulation layer 105. In some embodiments, the first gap-fill insulation layer 210 may include an oxide layer, a nitride layer or an oxynitride layer. In an embodiment, the first mask patterns 160 and the first hard mask patterns 140i may be removed during the planarization process to form the first gap-fill insulation layer 210. In another embodiment, the first mask patterns 160 and the first hard mask patterns 140i may be removed after forming the first intermediate pattern structures and before the first gap-fill insulation material is deposited as described above.

A second conductive layer 220 may be formed on the planarized first gap-fill insulation layer 210 and the barrier patterns 135i. The second conductive layer 220 may include a tungsten layer, a titanium layer, a tantalum layer, a platinum layer, a gold layer, an aluminum layer or a copper layer, but not limited thereto. In other embodiments, the second conductive layer 220 may include a conductive nitride layer, a conductive oxide layer or a doped semiconductor layer. The second conductive layer 220 may be formed using a PVD process or a CVD process. A second hard mask layer 230 may be formed on the second conductive layer 220. The second hard mask layer 230 may include a material having an etch rate lower than those of the second conductive layer 220, the barrier patterns 135i, the selection element patterns 130i, the variable resistive element patterns 120i, and the first conductive patterns 110i. The second hard mask layer 230 may include an oxide layer, a nitride layer, an oxynitride layer or a silicon layer.

Figure 7A:
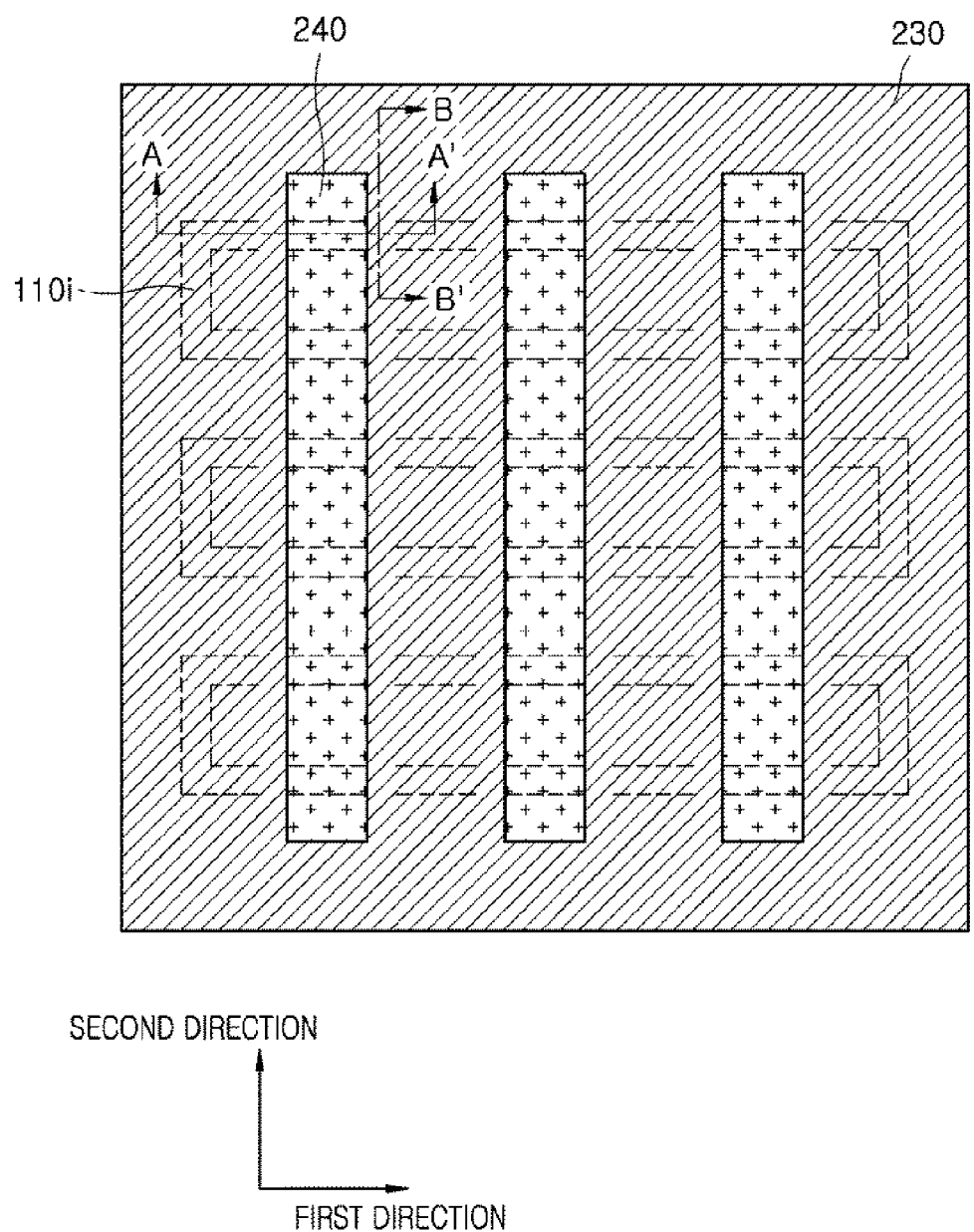
Figure 7B:
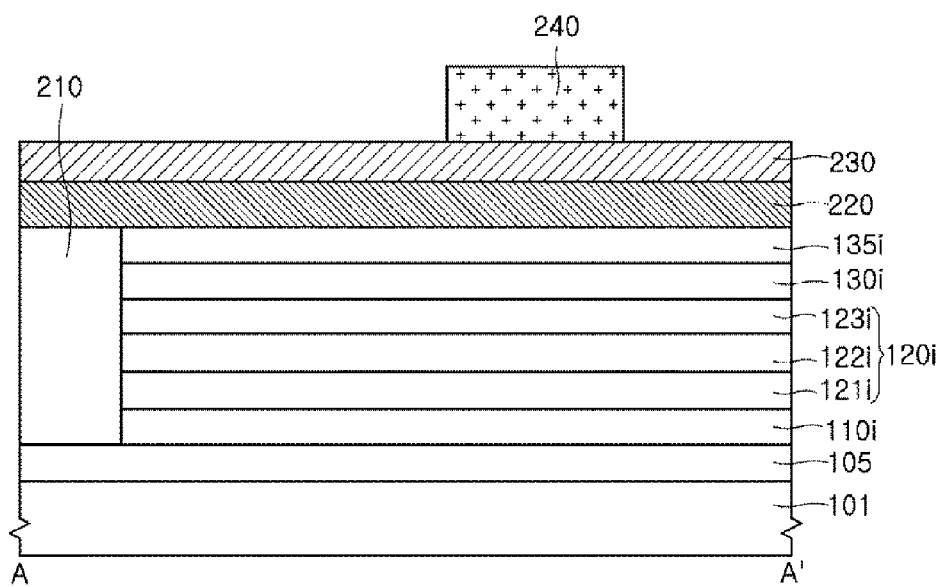
Figure 7C:
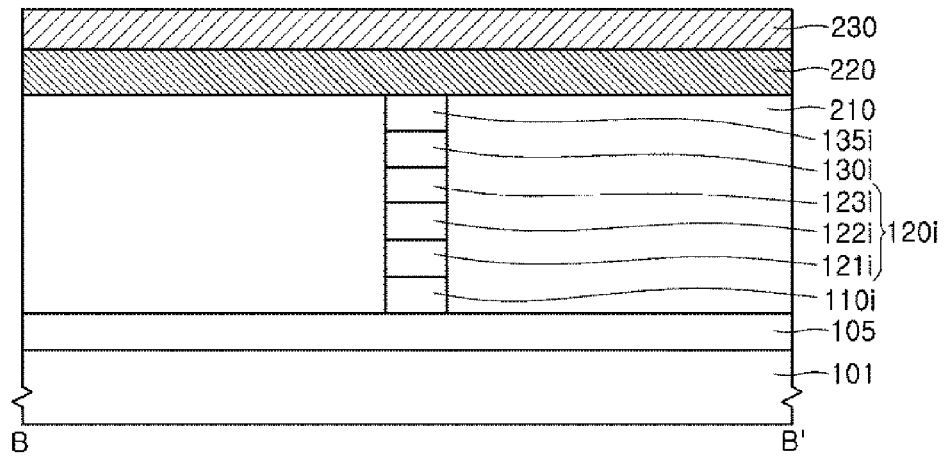

Referring to FIGS. 7A, 7B and 7C, line-shaped photoresist patterns 240 extending in the second direction may be formed on the second hard mask layer 230. The line-shaped photoresist patterns 240 may be formed by coating a photoresist layer on the second hard mask layer 230, exposing part of the photoresist layer with a photo mask, and developing the exposed part of the photoresist layer. Although FIG. 7A illustrates an example in which the second direction is substantially perpendicular to the first direction, embodiments of the present disclosure are not limited thereto. In other embodiments, the second direction may be a direction which forms an oblique angle with respect to the first direction.

Figure 8B:
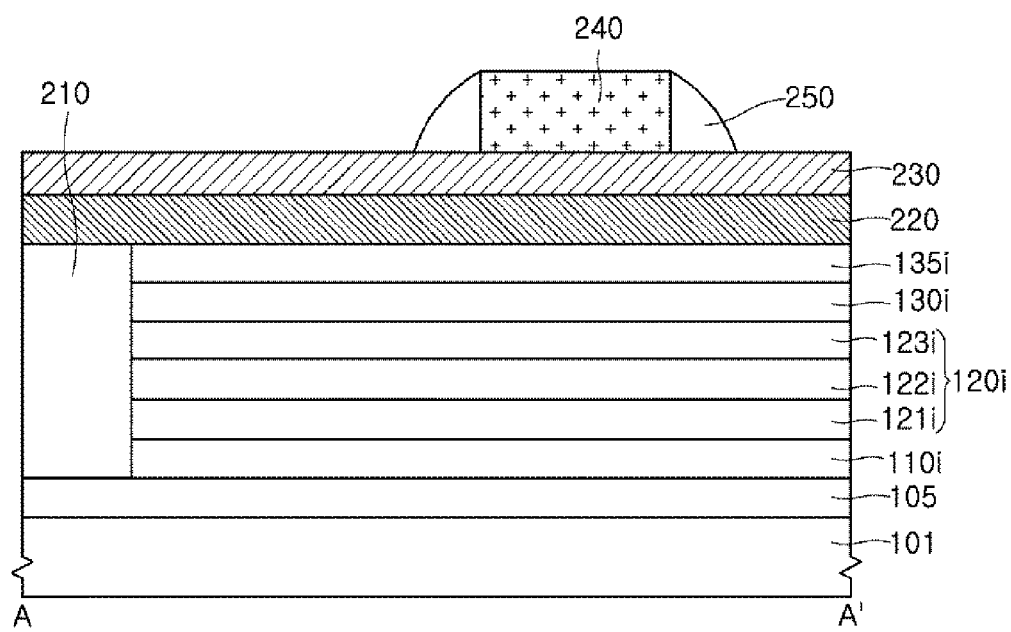
Figure 8C:
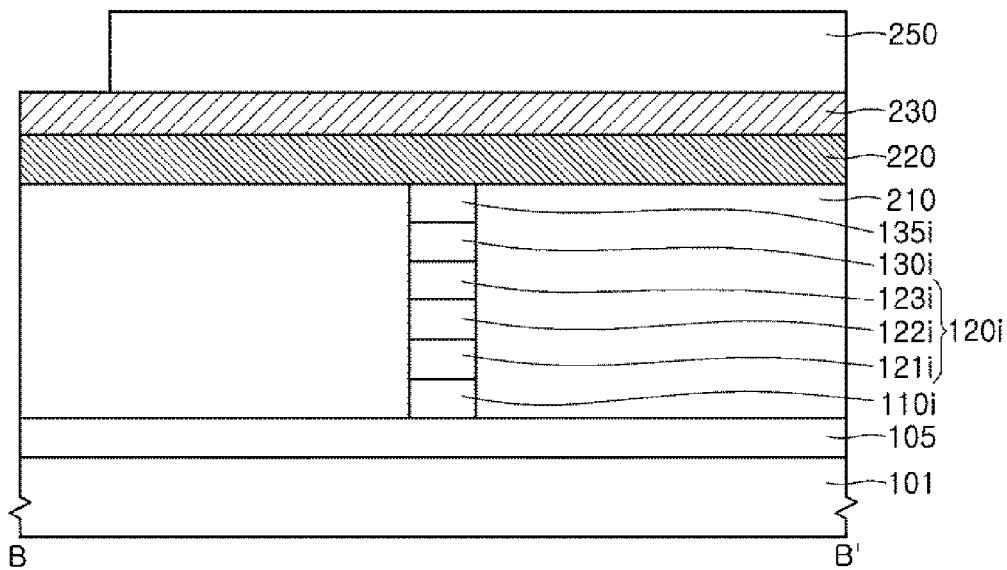

Referring to FIGS. 8A, 8B and 8C, spacers 250 may be formed on sidewalls of the line-shaped photoresist patterns 240. The spacers 250 may be formed of, for example, an oxide layer, a nitride layer or an oxynitride layer. The spacers 250 may be formed by depositing a spacer layer on the photoresist patterns 240 and then etching back the spacer layer so that the spacer layer only remains on the sidewalls of the line-shaped photoresist patterns 240. The spacer layer may be formed using, for example, a CVD process or a coating process. Each of the spacers 250 may be formed on four sidewalls of a corresponding one of the photoresist patterns 240.

Figure 9A:
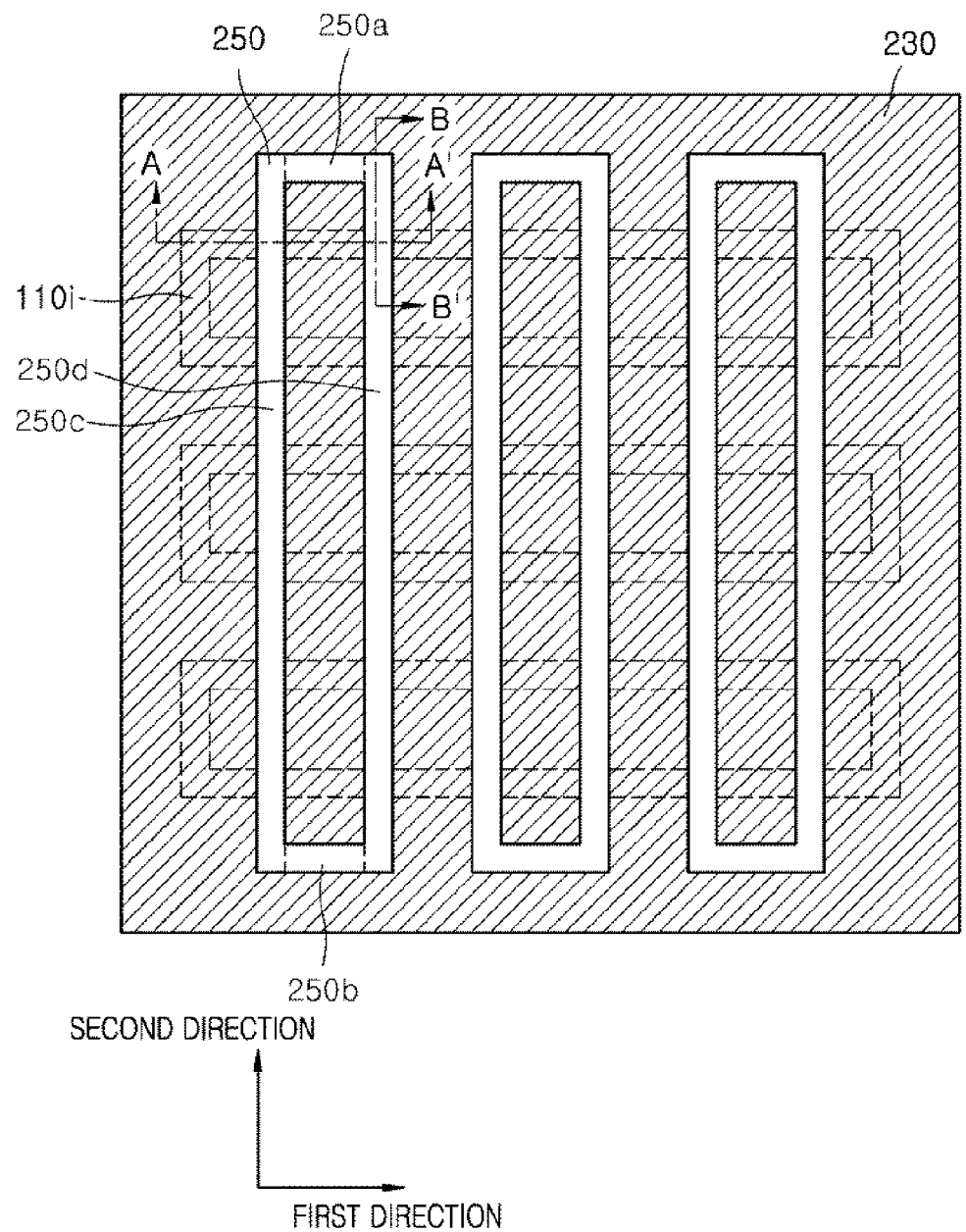
Figure 9B:
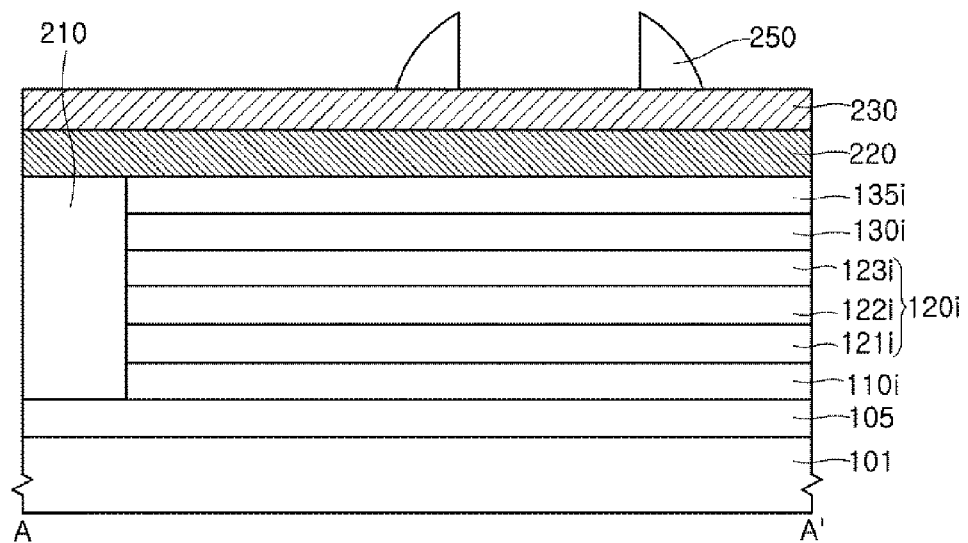
Figure 9C:
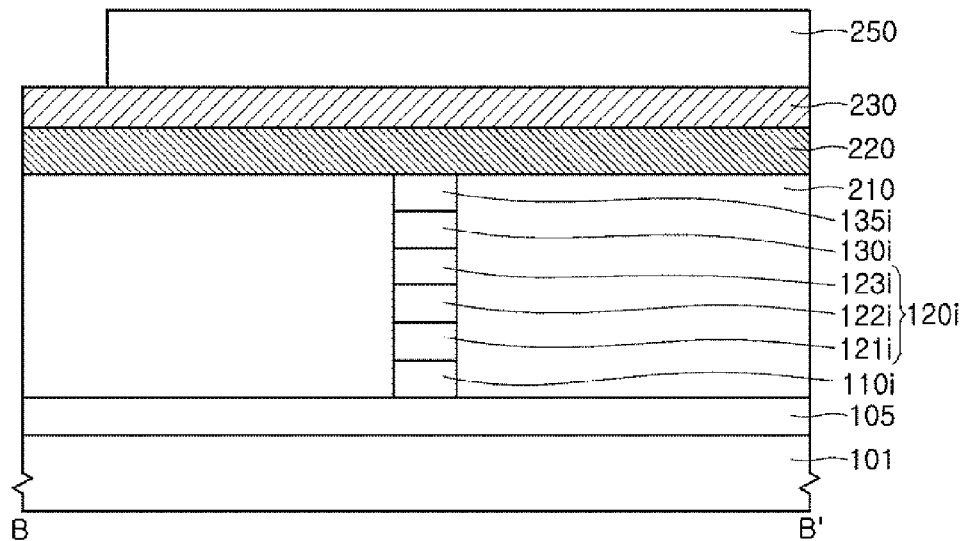

Referring to FIGS. 9A, 9B and 9C, the photoresist patterns 240 may be removed so that only the spacers 250 remain on the second hard mask layer 230. Each of the spacers 250 may include a pair of parallel line patterns 250c and 250d (also referred to herein as a pair of line-shaped patterns) extending in the second direction and a pair of end connectors 250a and 250b extending in the first direction. The end connectors 250a and 250b connect both end portions of one of the pair of parallel line patterns, e.g., 250c, to corresponding end portions of the other of the pair of parallel line patterns, e.g., 250d, respectively. As illustrated in FIG. 9A, each of the spacers 250 may have a rectangular shape including the pair of parallel line patterns 250c and 250d extending in the second direction and the pair of end connectors 250a and 250b extending in the first direction.

Figure 10A:
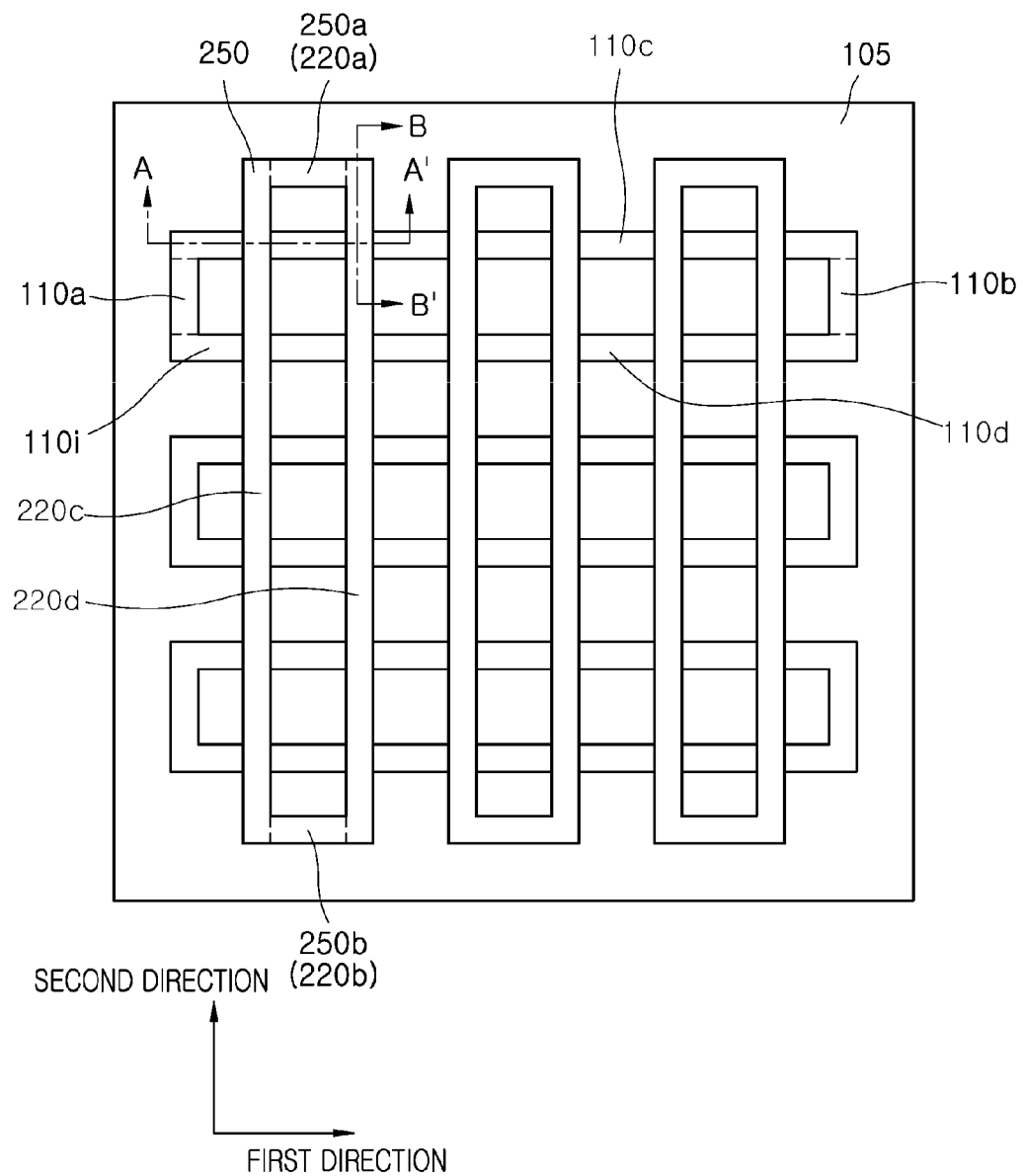
Figure 10B:
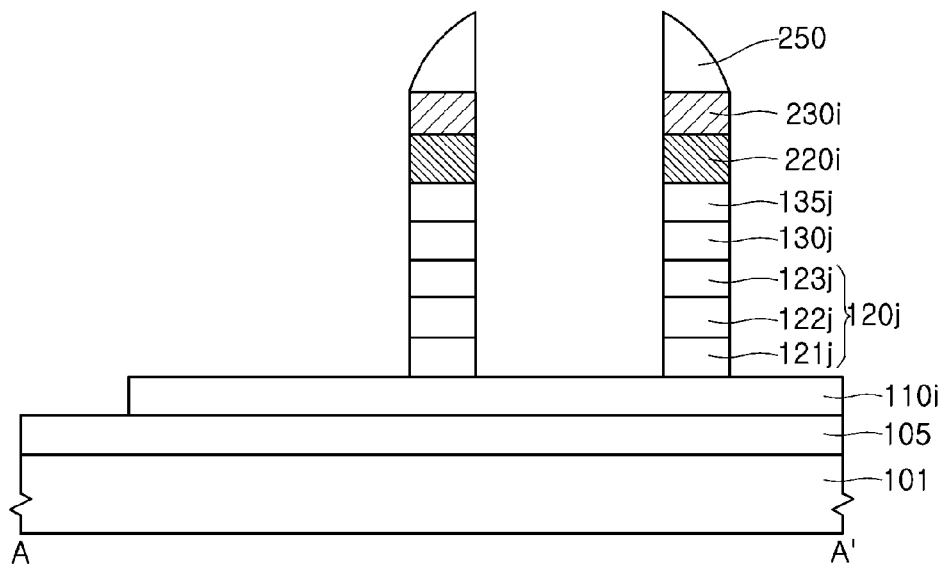
Figure 10C:
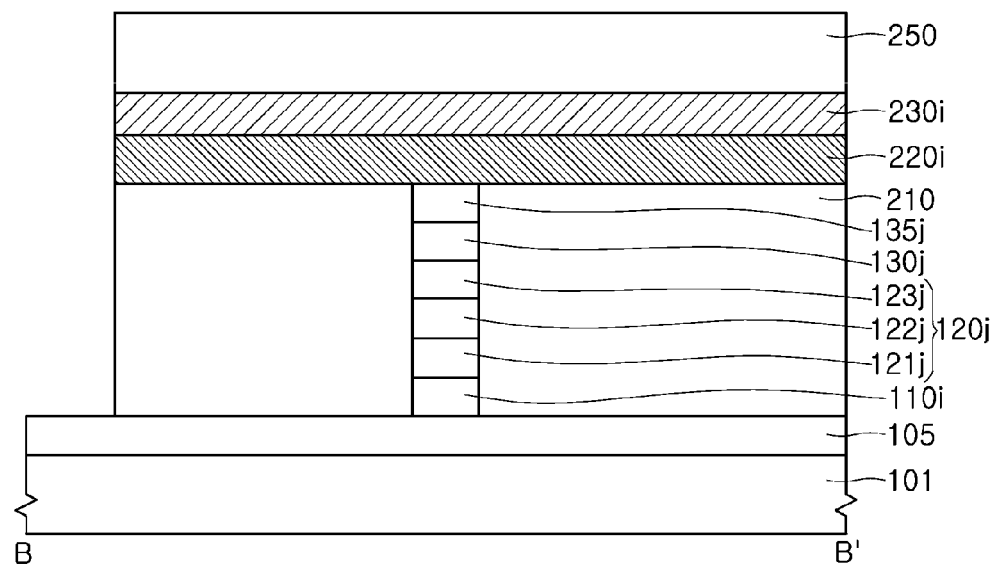

Referring to FIGS. 10A, 10B and 10C, the second hard mask layer 230, the second conductive layer 220, the first gap-fill insulation layer 210, the barrier patterns 135i, the selection element patterns 130i, and the variable resistive element patterns 120i may be etched using the spacers 250 (also referred to herein as second mask patterns) as etch masks, thereby forming second hard mask patterns 230i and second intermediate pattern structures. The second intermediate pattern structures may include second conductive patterns 220i, final barrier patterns 135j, final selection element patterns 130j, and final variable resistive element patterns 120j. In an embodiment, an anisotropic etching process is performed in a substantially vertical direction using the second mask patterns 250 as etch masks. In such a case, each of the final variable resistive element patterns 120j may include a first final electrode pattern 121j, a final variable resistive pattern 122j and a second final electrode pattern 123j, which are sequentially stacked.

The etch process for forming the second intermediate pattern structures may be performed until the first conductive patterns 110i and the base insulation layer 105 are exposed. That is, first portions of the second hard mask layer 230, the second conductive layer 220, the first gap-fill insulation layer 210, and the first intermediate pattern structures, which are disposed over the first conductive patterns 110i, may be etched until the first conductive patterns 110i are exposed. Moreover, second portions of the second hard mask layer 230, the second conductive layer 220, the planarized first gap-fill insulation layer 210, and the first intermediate pattern structures, which are not disposed over the first conductive patterns 110i, may be etched until the base insulation layer 105 is exposed.

During the etch process for forming the second intermediate pattern structures, a pattern shape of the second mask patterns 250 may be transferred to the second hard mask layer 230 to provide the second hard mask patterns 230i. That is, the second hard mask patterns 230i may have substantially the same pattern shape as the second mask patterns 250. Thus, the second hard mask patterns 230i may act as etch masks while the second intermediate pattern structures are formed.

In some embodiments, each of the second intermediate pattern structures may include the first conductive patterns 110i, the second conductive patterns 220i, and one of pillar structures disposed at intersections of the first and second conductive patterns 110i and 220i. Each of the first conductive patterns 110i may include a pair of first conductive lines 110c and 110d extending in the first direction and a pair of first conductive connectors 110a and 110b extending in the second direction. The first conductive connectors 110a and 110b connect both end portions of one of the pair of first conductive lines, e.g., 110c, to corresponding end portions of the other of the pair of first conductive lines, e.g., 110d, respectively, as illustrated in FIG. 10A. Similarly, each of the second conductive patterns 220i may include a pair of second conductive lines 220c and 220d extending in the second direction and a pair of second conductive connectors 220a and 220b extending in the first direction. The second conductive connectors 220a and 220b connect both end portions of one of the pair of second conductive lines, e.g., 220c, to corresponding end portions of the other of the pair of second conductive lines, e.g., 220d, respectively. That is, each of the first and second conductive patterns 110i and 220i may include four straight line patterns corresponding to four sides of a rectangle. In addition, each of the second conductive lines 220c and 220d of each of the second conductive patterns 220i may cross all of the first conductive lines 110c and 110d of the first conductive patterns 110i.

Each of the pillar structures may include the final variable resistive element pattern 120j, the final selection element pattern 130j and the final barrier pattern 135j, which are sequentially stacked. Thus, each of the pillar structures may function as an RRAM cell.

In an embodiment, the second mask patterns 250 and the second hard mask patterns 230i may be removed during or after forming the second intermediate pattern structures.

Figure 11A:
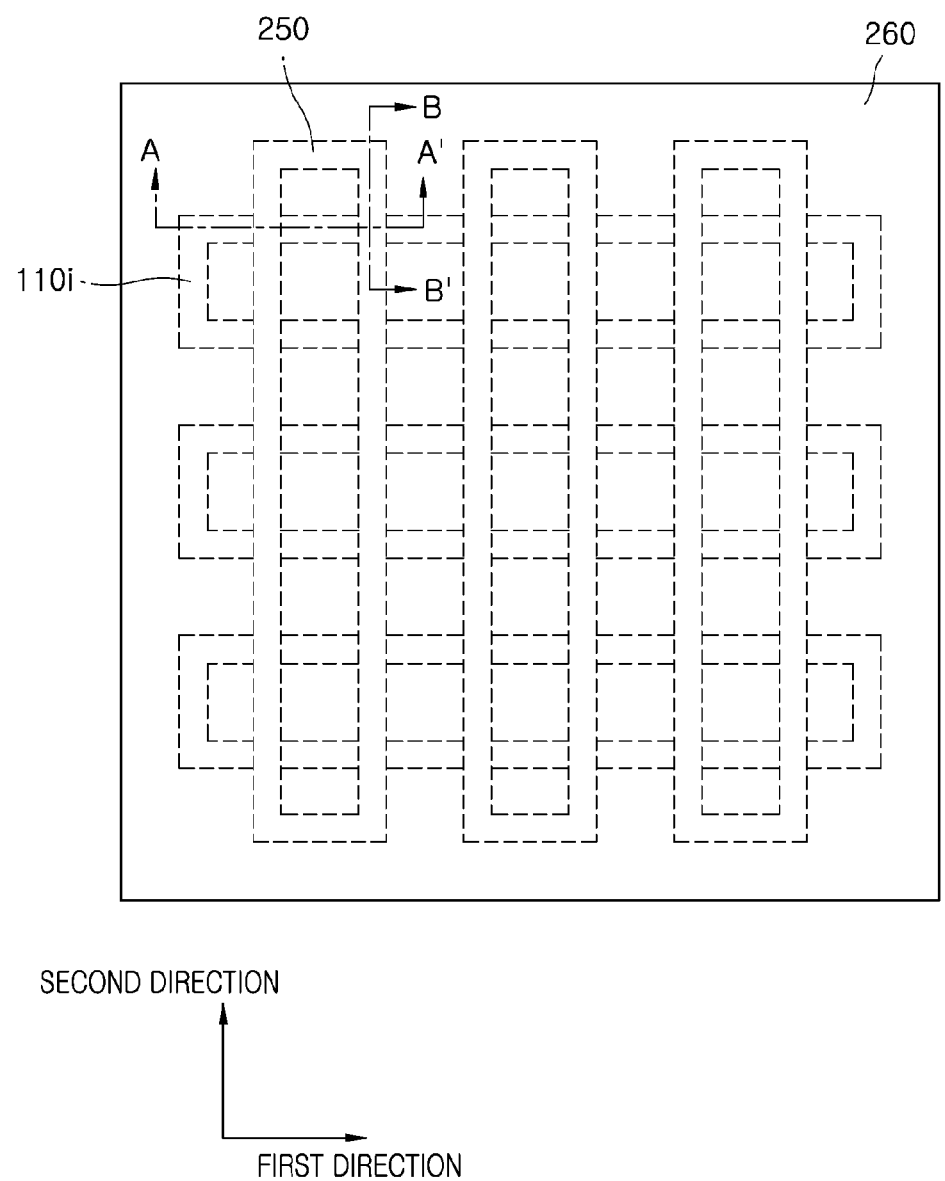
Figure 11B:
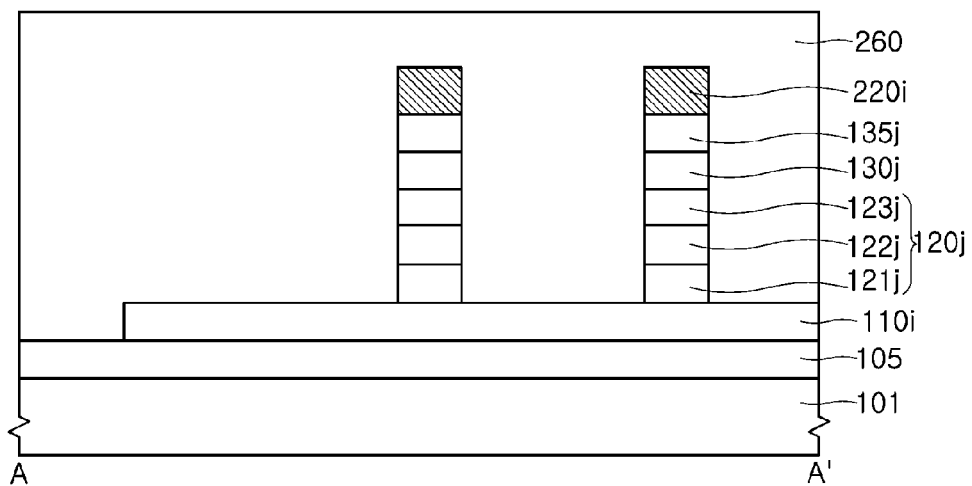
Figure 11C:
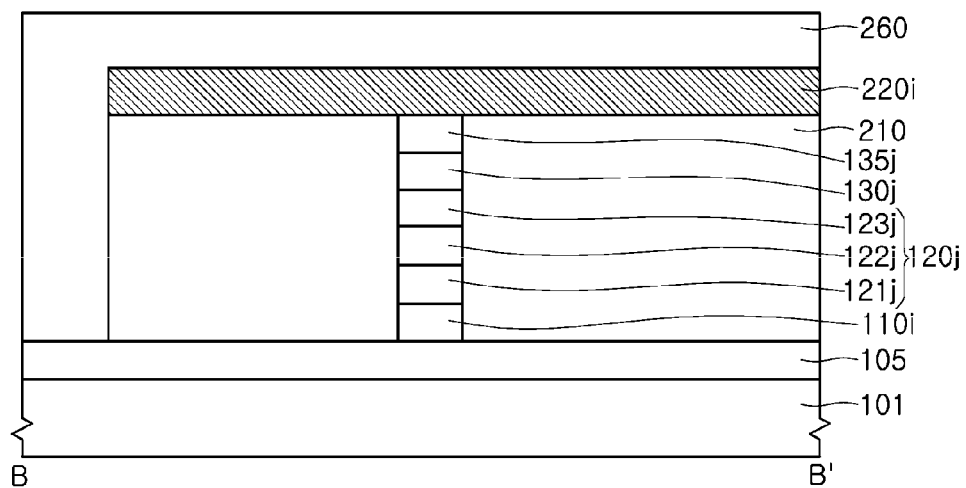

After that, referring to FIGS. 11A, 11B and 11C, a second gap-fill insulation material may be deposited on the resultant structure of FIGS. 10A, 10B and 10C to fill at least gap regions between the second intermediate pattern structures and inside regions surrounded by the second intermediate pattern structures. Then, the deposited second gap-fill insulation material may be planarized using an etch-back process or a chemical mechanical polishing (CMP) process until top surfaces of the second conductive patterns 220i are exposed. In addition, the same material as the second gap-fill insulation material may be deposited to cover the planarized structures-gap-fill to form a second gap-fill insulation layer 260. The second gap-fill insulation layer 260 may include a material having an etch rate higher than that of the base insulation layer 105.

Figure 12A:
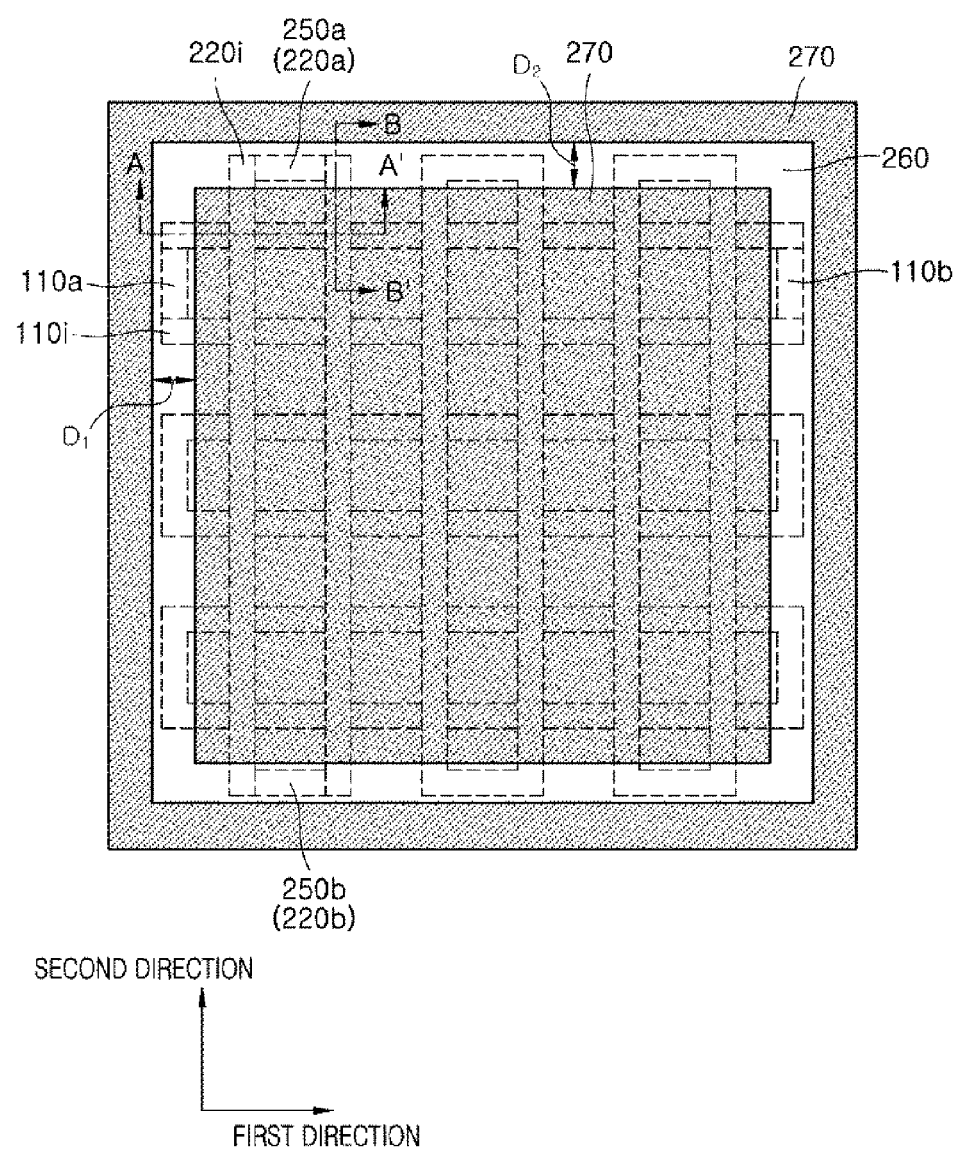

Referring to FIGS. 12A, 12B and 12C, a cut mask pattern 270 may be formed on the planarized second gap-fill insulation layer 260. The cut mask pattern 270 may be formed of a photoresist layer. In some embodiments, the cut mask pattern 270 may include a trench 275 that exposes portions of the planarized second gap-fill insulation layer 260 which are disposed over the end connectors 110a, 110b, 220a and 220b. In an embodiment, a width D1 and D2 of the trench 275 is greater than widths of the end connectors 110a, 110b, 220a and 220b so as to sufficiently remove the end connectors 110a, 110b, 220a and 220b in a subsequent etch process, but the trench 275 does not overlap with intersection regions of the first and second conductive lines 110c, 110d, 220a and 220b in a plan view. As a result, sidewalls of the final variable resistive element patterns disposed in the intersection regions may not be exposed as a result of the subsequent etch process.

Figure 13B:
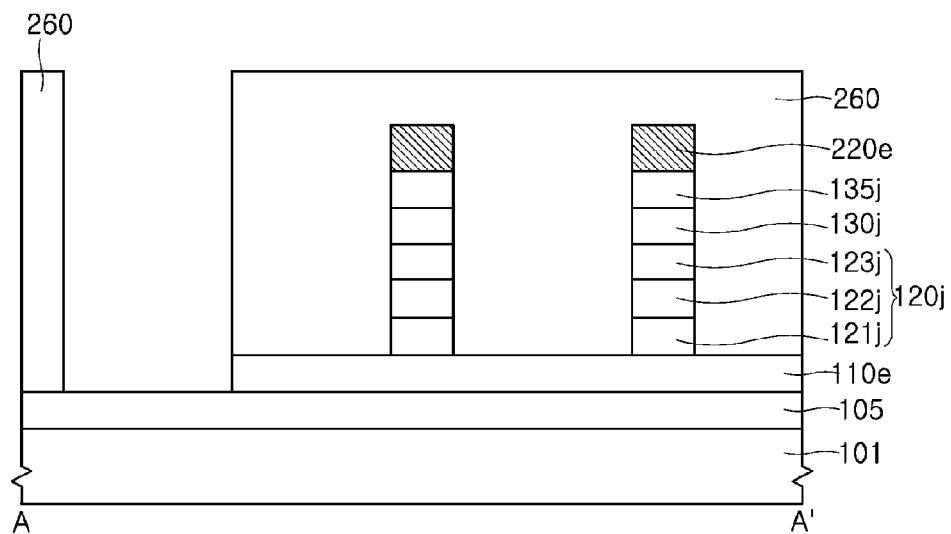
Figure 13C:
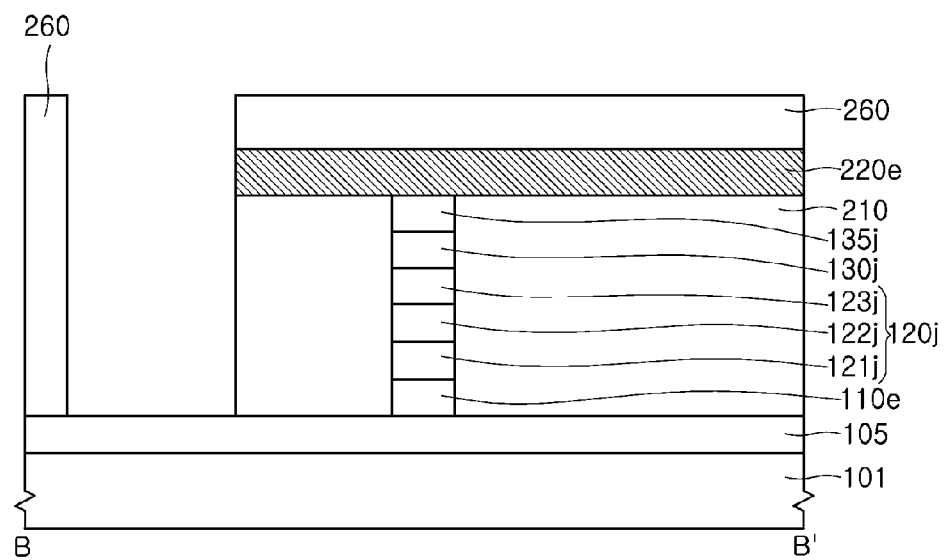

Referring to FIGS. 13A, 13B and 13C, the second gap-fill insulation layer 260, the second conductive patterns 220i, the first gap-fill insulation layer 210, and the first conductive patterns 110i may be etched using the cut mask pattern 270 as an etch mask until the base insulation layer 105 is exposed. Thus, the conductive connectors 110a, 110b, 220a and 220b may be substantially removed to separate the first and second conductive lines 110c, 110d, 220c, and 220d of each of the first and second conductive patterns 110i and 220i from each other. As a result, a plurality of first separate conductive lines 110e and a plurality of second separate conductive lines 220e may be formed. Subsequently, the cut mask pattern 270 may be removed using an ashing process such as an oxygen plasma process. While the cut mask pattern 270 is removed using the ashing process, all of sidewalls of the final variable resistive element patterns 120j having pillar shapes may be covered with the first and second gap-fill insulation layers 210 and 260. Thus, the first and second gap-fill insulation layers 210 and 260 may substantially prevent the sidewalls of the final variable resistive element patterns 120j from being oxidized during the ashing process.

As described above, since the first and second intermediate pattern structures are formed using the SPT process, the SPT process may produce fine patterns including the first and second conductive patterns 110i and 220i. As a result, the degree of integration of a semiconductor device having a cross point cell array structure, which includes a plurality of memory cells disposed at intersections between the first and second conductive patterns 110i and 220i, may be increased.

In embodiments, both end portions of one of a pair of first conductive lines (or second conductive lines) in each of the first conductive patterns 110i (or second conductive patterns 220i) may be connected to corresponding end portions of the other of the pair of first conductive lines (or second conductive lines) through the first conductive connectors 110a and 110b (or second conductive connectors 220a and 220b), respectively. However, according to the embodiments, the end connectors 110a, 110b, 220a and 220b may be simultaneously removed by a single etch process performed using the cut mask pattern 270 as an etch mask after the first and second conductive patterns 110i and 220i are formed. Sidewalls of the final variable resistive element patterns 120j having pillar shapes may be covered with the gap-fill insulation layers 210 and 260 while the conductive connectors 110a, 110b, 220a and 220b are removed. That is, in the above embodiments, the sidewalls of the final variable resistive element patterns 120j may be prevented from being exposed during removal of the conductive connectors 110a, 110b, 220a and 220b. Accordingly, the sidewalls of the final variable resistive element patterns 120j may be prevented from being oxidized during the separation process of the first and second conductive lines of the first and second conductive patterns 110i and 220i, thereby improving the reliability of the semiconductor device including the cross point cell array in accordance with the above embodiments.

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A method of fabricating a semiconductor device including a cross point cell array, the method comprising:
   forming a first stack structure including a first conductive layer over a substrate;
   forming a first mask pattern over the first stack structure, wherein the first mask pattern includes a pair of first line-shaped patterns extending in a first direction and a pair of first end connectors connecting both end portions of one of the pair of first line-shaped patterns to corresponding end portions of the other of the pair of first line-shaped patterns, respectively;
   etching the first stack structure using the first mask pattern as an etch mask to form a first intermediate pattern structure including a pair of parallel line patterns;
   forming a first gap-fill insulation layer to fill a space between the parallel line patterns of the first intermediate pattern structure;
   forming a second stack structure including a second conductive layer over the first gap-fill insulation layer and the first intermediate pattern structure;
   forming a second mask pattern over the second stack structure, wherein the second mask pattern includes a pair of second line-shaped patterns extending in a second direction crossing the first direction and a pair of second end connectors connecting both end portions of one of the pair of second line-shaped patterns to corresponding end portions of the other of the pair of second line-shaped patterns, respectively;
   etching the second stack structure and the first intermediate pattern structure using the second mask pattern as an etch mask to form a second intermediate pattern structure, wherein the second intermediate pattern structure includes a pair of first conductive lines extending in the first direction, a pair of first conductive connectors connecting both end portions of one of the pair of first conductive lines to corresponding end portions of the other of the pair of first conductive lines, a pair of second conductive lines crossing the pair of first conductive lines, a pair of second conductive connectors connecting both end portions of one of the pair of second conductive lines to corresponding end portions of the other of the pair of second conductive lines;
   forming a second gap-fill insulation layer over the substrate to fill a space between the pair of second conductive lines of the second intermediate pattern structure;
   forming a cut mask pattern over the second gap-fill insulation layer to expose portions of the second gap fill insulation layer disposed over the first and second conductive connectors;
   etching the second-gap-fill insulation layer and the second intermediate pattern structure using the cut mask pattern as an etch mask to remove the first and second conductive connectors; and
   wherein the cut mask pattern includes a trench to expose the portions of the second gap-fill insulation layer disposed over the first and second conductive connectors, and
   wherein the trench has a width that is greater than widths of the first and second conductive connectors and does not overlap with intersection regions of the first and second conductive lines.

2. The method of claim 1, further comprising:
   forming a base insulation layer between the substrate and the first stack structure,
   wherein forming the first stack structure includes sequentially stacking the first conductive layer, a variable resistive element structure, and a first hard mask layer over the base insulation layer.

3. The method of claim 2, wherein the variable resistive element structure is formed by sequentially stacking a first electrode layer, a variable resistive layer and a second electrode layer.

4. The method of claim 3, wherein at least one of the first and second electrode layers includes carbon.

5. The method of claim 3, further comprising forming a selection element structure between the variable resistive element structure and the first hard mask layer.

6. The method of claim 5, further comprising forming a barrier layer between the selection element structure and the first hard mask layer,
   wherein forming the selection element structure includes forming at least one selection element layer over the second electrode layer.

7. The method of claim 2, wherein etching the first stack structure using the first mask pattern to form the first intermediate pattern structure includes etching the variable resistive element structure and the first conductive layer until the base insulation layer is exposed.

8. The method of claim 1, wherein forming the first mask pattern over the first stack structure includes:
   forming a line-shaped photoresist pattern extending in the first direction over the first stack structure;
   forming a spacer over sidewalls of the line-shaped photoresist pattern; and
   removing the line-shaped photoresist pattern so that the spacer remains over the first stack structure.

9. The method of claim 1, wherein forming the second stack structure includes:
   forming the second conductive layer over the first gap-fill insulation layer and the first intermediate pattern structure; and
   forming a second hard mask layer over the second conductive layer.

10. The method of claim 1, wherein forming the second mask pattern over the second stack structure includes:
    forming a line-shaped photoresist pattern extending in the second direction over the second stack structure;
    forming a spacer over sidewalls of the line-shaped photoresist pattern; and
    removing the line-shaped photoresist pattern so that the spacer remains over the second stack structure.

11. The method of claim 2, wherein etching the second stack structure and the first intermediate pattern structure includes etching the second stack structure and the first intermediate pattern structure until the base insulation layer and the first conductive layer are exposed.

12. The method of claim 1, wherein the second intermediate pattern structure further includes pillar structures disposed at intersections of the first and second conductive lines.

13. The method of claim 12, wherein the pillar structures include variable resistive elements, respectively, the method further comprising removing the cut mask pattern while sidewalls of the variable resistive elements are covered by the first and second gap-fill insulation layers.

14. A method of fabricating a semiconductor device including a cross point array, the method comprising:
    forming a first conductive layer over a base insulation layer;
    forming a variable resistive element structure over the first conductive layer;
    patterning the variable resistive element structure and the first conductive layer using a first mask pattern having a sidewall spacer shape to form a first intermediate pattern structure including a pair of parallel line patterns, wherein the first mask pattern includes a pair of first line-shaped patterns extending in a first direction and a pair of first end connectors connecting both end portions of one of the pair of first line-shaped patterns to corresponding end portions of the other of the pair of first line-shaped patterns;
    forming a first gap-fill insulation layer over the base insulation layer to fill a space between the pair of the parallel line patterns of the first intermediate pattern structure;
    forming a second conductive layer over the first intermediate pattern structure and the base insulation layer;
    patterning the second conductive layer and the first intermediate pattern structure using a second mask pattern having a sidewall spacer shape to form a second intermediate pattern structure, wherein the second intermediate pattern structure includes a pair of first conductive lines extending in the first direction, a pair of first conductive connectors connecting both end portions of one of the pair of first conductive lines to corresponding end portions of the other of the pair of first conductive lines, a pair of second conductive lines crossing the pair of first conductive lines, a pair of second conductive connectors connecting both end portions of one of the pair of second conductive lines to corresponding end portions of the other of the pair of second conductive lines, and pillar structures disposed at intersections of the first and second conductive lines and including variable resistive elements;
    forming a second gap-fill insulation layer that fills spaces between the pair of second conductive lines of the second intermediate pattern structure to cover sidewalls of the variable resistive elements of the second intermediate pattern structure;
    forming a cut mask pattern over the second gap-fill insulation layer to expose portions of the second gap fill insulation layer disposed over the first and second conductive connectors;
    etching the second gap-fill insulation layer and the second intermediate pattern structure using the cut mask pattern as an etch mask to remove the first and second conductive connectors while the sidewalls of the variable resistive elements are covered by the first and second gap-fill insulation layers; and
    wherein the cut mask pattern includes a trench to expose the portions of the second gap-fill insulation layer disposed over the first and second conductive connectors, and
    wherein the trench has a width that is greater than widths of the first and second conductive connectors and does not overlap with intersection regions of the first and second conductive lines.

15. The method of claim 14, wherein the first and second mask patterns include any of an oxide layer, a nitride layer, an oxynitride layer, a silicon layer, and a combination thereof.

16. The method of claim 14, wherein forming the first intermediate pattern structure includes:
    forming a first photoresist pattern over the variable resistive element structure, wherein the first photoresist pattern extends in the first direction;
    forming a spacer over sidewalls of the first photoresist pattern;
    removing the first photoresist pattern so that the spacer remains over the variable resistive element structure; and
    etching the variable resistive element structure and the first conductive layer using the spacer as an etch mask.

17. The method of claim 14, wherein forming the second intermediate pattern structure includes:
    forming a second photoresist pattern over the second conductive layer, wherein the second photoresist pattern extends in a second direction intersecting the first direction;
    forming a spacer over sidewalls of the second photoresist pattern;
    removing the second photoresist pattern so that the spacer remains over the second conductive layer; and
    etching the second conductive layer and the first intermediate pattern structure using the spacer as an etch mask to expose the base insulation layer and the first conductive pattern.

18. A method of fabricating a semiconductor device including a cross point cell array, the method comprising:
    forming a first stack structure including a first conductive layer over a substrate;
    forming a first mask pattern over the first stack structure, wherein the first mask pattern has a sidewall spacer shape;

etching the first stack structure using the first mask pattern as an etch mask to form a first intermediate pattern structure including a first conductive pattern, the first conductive pattern including a pair of first conductive lines extending in a first direction and a pair of first conductive connectors connecting both end portions of one of the pair of first conductive lines to corresponding end portions of the other of the pair of first conductive lines, respectively;

forming a first gap-fill insulation layer to fill a space between the first intermediate pattern structure and an adjacent first intermediate pattern structure and a space surrounded by the first intermediate pattern structure;

forming a second stack structure including a second conductive layer over the first gap-fill insulation layer and the first intermediate pattern structure;

forming a second mask pattern over the second stack structure, wherein the second mask pattern has a sidewall spacer shape;

etching the second stack structure and the first intermediate pattern structure using the second mask pattern as an etch mask to form a second intermediate pattern structure, wherein the second intermediate pattern structure includes the first conductive pattern and a second conductive pattern, the second conductive pattern including a pair of second conductive lines extending in a second direction, crossing the first direction, to cross the pair of first conductive lines, and a pair of second conductive connectors connecting both end portions of one of the pair of second conductive lines to corresponding end portions of the other of the pair of second conductive lines, respectively;

forming a second gap-fill insulation layer to fill a space between the second intermediate pattern structure and an adjacent second intermediate pattern structure and a space surrounded by the second intermediate pattern structure;

forming a cut mask pattern over the second gap-fill insulation layer to expose portions of the second gap-fill insulation layer disposed over the first and second conductive connectors; and etching the second gap-fill insulation layer and the second intermediate pattern structure using the cut mask pattern as an etch mask to remove the first and second conductive connectors; and wherein the cut mask pattern includes a trench to expose the portions of the second gap-fill insulation layer disposed over the first and second conductive connectors, and wherein the trench has a width that is greater than widths of the first and second conductive connectors and does not overlap with intersection regions of the first and second conductive lines.

\* \* \* \* \*